US012683152B1

(12) United States Patent
Jang

(10) Patent No.: US 12,683,152 B1
(45) Date of Patent: Jul. 14, 2026

(54) METHOD OF PRODUCING A BATTERY ANODE ACTIVE MATERIAL COMPRISING A POROUS HOST STRUCTURE AND SILICON RESIDING IN THE HOST PORES

(71) Applicant: Honeycomb Battery Company, Dayton, OH (US)

(72) Inventor: Bor Z. Jang, Centerville, OH (US)

(73) Assignee: Honeycomb Battery Company, Dayton, OH (US)

( * ) Notice: Subject to any disclaimer, the term of this patent is extended or adjusted under 35 U.S.C. 154(b) by 0 days.

(21) Appl. No.: 19/026,239

(22) Filed: Jan. 16, 2025

(51) Int. Cl.
| | |
|---|---|
| *C01B 32/184* | (2017.01) |
| *C01B 32/194* | (2017.01) |
| *C01B 32/348* | (2017.01) |
| *C01B 33/03* | (2006.01) |
| *C23C 16/24* | (2006.01) |
| *C23C 16/44* | (2006.01) |
| *H01M 4/04* | (2006.01) |
| *H01M 4/1395* | (2010.01) |
| *H01M 4/36* | (2006.01) |
| *H01M 4/38* | (2006.01) |
| *H01M 4/62* | (2006.01) |
| *H01M 10/42* | (2006.01) |
| *H01M 4/02* | (2006.01) |

(52) U.S. Cl.
CPC ........... *H01M 4/386* (2013.01); *C01B 32/184* (2017.08); *C01B 32/194* (2017.08); *C01B 32/348* (2017.08); *C01B 33/03* (2013.01); *C23C 16/24* (2013.01); *C23C 16/4417*
(2013.01); *H01M 4/0404* (2013.01); *H01M 4/0421* (2013.01); *H01M 4/1395* (2013.01); *H01M 4/366* (2013.01); *H01M 4/625* (2013.01); *H01M 10/4235* (2013.01); *C01B 2204/22* (2013.01); *C01P 2004/80* (2013.01); *C01P 2006/40* (2013.01); *H01M 2004/027* (2013.01)

(58) Field of Classification Search
CPC .... H01M 4/386; C01B 32/184; C01B 32/194; C01B 32/348; C01B 33/03
See application file for complete search history.

(56) References Cited

U.S. PATENT DOCUMENTS

| | | | | |
|---|---|---|---|---|
| 2020/0227734 A1* | 7/2020 | Zhamu | .................. | H01M 4/386 |
| 2022/0069281 A1* | 3/2022 | Mishra | .................. | H01M 4/624 |

* cited by examiner

*Primary Examiner* — Nathan T Leong

(57) ABSTRACT

A method of producing multiple particulates having pores containing Si therein, comprising: (a) providing a porous conductive host structure having from 5% to 99.9% of pores; (b) introducing a halogen gas that chemically reacts with Si at a first temperature to form a silicon halide, wherein the silicon halide is selected from $SiF_4$, $SiCl_4$, $SiI_4$, $SiBr_4$, and/or $SiX_aZ_b$, wherein X and Z are each a halogen element and a=1-3, b=1-3, and a+b=4; (c) vaporizing the silicon halide to form a vapor phase and directing the silicon halide vapor into pores of the host and facilitating the silicon halide to decompose into a halogen gas product and solid Si particles or coating deposited at a second temperature in the pores to form a Si-infiltrated porous host structure; and (d) optionally breaking and reducing said Si-infiltrated host structure into smaller porous particles.

20 Claims, 6 Drawing Sheets

Solid electrolyte or a porous separator + liquid electrolyte; electrolyte is typically present in the anode and the cathode Cathode Anode containing Si residing in pores of a porous conductive material host Si Solid electrolyte or a
porous separator + liquid
electrolyte; electrolyte is
typically present in the
anode and the cathode Cathode Anode containing Si
residing in pores of a
porous conductive
material host Si $SiCl_4 \rightarrow Si + 2Cl_2$ or
$SiCl_4(g) + 2 H_2(g) \rightarrow$
$Si (s) + 4 HCl(g)$

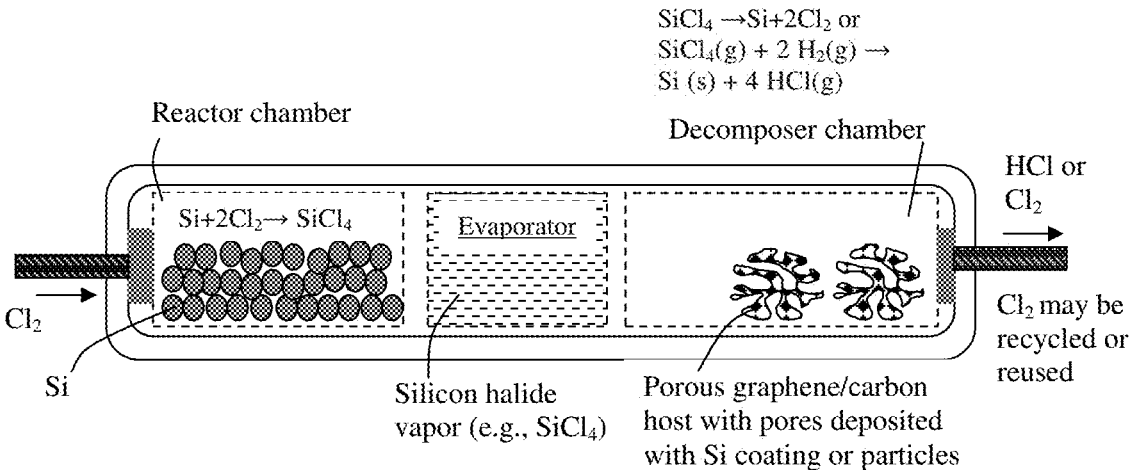

Reactor chamber

Decomposer chamber $Si + 2Cl_2 \rightarrow SiCl_4$

Evaporator

HCl or
$Cl_2$ $Cl_2$

Si

Silicon halide
vapor (e.g., $SiCl_4$)

Porous graphene/carbon
host with pores deposited
with Si coating or particles $Cl_2$ may be
recycled or
reused

FIG. 4(A)

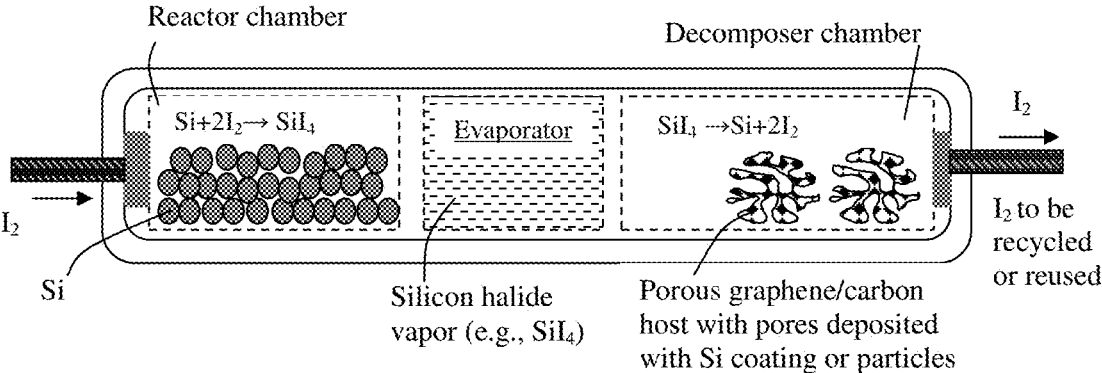

Reactor chamber

Decomposer chamber $Si + 2I_2 \rightarrow SiI_4$

Evaporator $SiI_4 \rightarrow Si + 2I_2$ $I_2$ $I_2$

Si

Silicon halide
vapor (e.g., $SiI_4$)

Porous graphene/carbon
host with pores deposited
with Si coating or particles $I_2$ to be
recycled
or reused

FIG. 4(B)

METHOD OF PRODUCING A BATTERY ANODE ACTIVE MATERIAL COMPRISING A POROUS HOST STRUCTURE AND SILICON RESIDING IN THE HOST PORES

FIELD

The present invention provides a method of producing a porous host containing Si deposited in the pores of the porous host (e.g., porous particles of carbon, graphite, graphene, or metal) for use in the anode (negative electrode) of a rechargeable lithium or sodium battery.

BACKGROUND

Concerns over the safety of earlier lithium secondary batteries led to the development of lithium ion secondary batteries, in which pure lithium metal sheet or film was replaced by carbonaceous materials as the negative electrode (anode). The carbonaceous material may comprise primarily graphite that is intercalated with lithium and the resulting graphite intercalation compound may be expressed as $Li_xC_6$, where x is typically less than 1. In order to minimize the loss in energy density due to this replacement, x in $Li_xC_6$ must be maximized and the irreversible capacity loss $Q_{ir}$ in the first charge of the battery must be minimized. The maximum amount of lithium that can be reversibly intercalated into the interstices between graphene planes of a perfect graphite crystal is generally believed to occur in a graphite intercalation compound represented by $Li_xC_6$ (x=1), corresponding to a theoretical specific capacity of 372 mAh/g.

In addition to carbon- or graphite-based anode materials, other inorganic materials that have been evaluated for potential anode applications include metal oxides, metal nitrides, metal sulfides, and a range of metals, metal alloys, and intermetallic compounds that can accommodate lithium atoms/ions. In particular, lithium alloys having a composition formula of $Li_aA$ (A is a metal such as Al, and "a" satisfies 0<a<5) has been investigated as potential anode materials. This class of anode active materials has a higher theoretical capacity, e.g., $Li_4Si$ (maximum capacity=3,829 mAh/g), $Li_{4.4}Si$ (maximum capacity of Si=4,200 mAh/g), $Li_{4.4}Ge$ (maximum capacity of Ge=1,623 mAh/g), $Li_{4.4}Sn$ (maximum capacity of Sn=993 mAh/g), $Li_3Cd$ (maximum capacity of Cd=715 mAh/g), $Li_3Sb$ (maximum capacity of Sb=660 mAh/g), $Li_{4.4}Pb$ (569 mAh/g), LiZn (410 mAh/g), and $Li_3Bi$ (385 mAh/g).

An anode active material is normally used in a powder form, which is mixed with conductive additives and bonded by a binder resin. The binder also serves to bond the mixture to a current collector. Alternatively, an anode active material may be coated as a thin film onto a current collector. On repeated charge and discharge operations, the alloy particles tend to undergo pulverization and the current collector-supported thin films are prone to fragmentation due to expansion and contraction of the anode active material during the insertion and extraction of lithium ions. This pulverization or fragmentation results in loss of particle-to-particle contacts between the active material and the conductive additive or contacts between the anode material and its current collector. These adverse effects result in a significantly shortened charge-discharge cycle life.

To overcome the problems associated with such mechanical degradation, several approaches have been proposed, including (a) using nano-scaled particles of an anode active material, (b) composites composed of small electrochemically active particles supported by less active or non-active matrices or coatings, (c) metal alloying, and (d) using amorphous anode active material (instead of crystalline form). For instance, there has been work reported on synthesizing amorphous and nanostructured forms of silicon such as nanoparticles, nanowires and nanotubes. This was mostly based on the well-known electrochemical lithiation induced crystalline-to-amorphous silicon phase transformation during the first few cycles as well as conditions employed for synthesis of amorphous silicon.

It is generally believed that the nanostructured and amorphous forms of silicon provide mechanical integrity without pulverization due to the reduced number density of atoms within a nano-sized grain and the 'free volume' effects in amorphous silicon which results in better capacity retention and cycle life. Further, due to the presence of defects and absence of long range order in amorphous silicon, the volume expansion upon lithium insertion can be distributed homogenously and the net effect of crack formation and propagation can be less catastrophic compared to crystalline silicon. Hence, the amount of pulverization of the active material is significantly reduced which gives rise to enhanced capacity retention and cyclability.

Amorphous silicon is generally obtained by physical and chemical vapor deposition methods. Physical vapor deposition methods include RF or magnetron sputtering and pulsed laser deposition using silicon targets. Chemical vapor deposition methods include thermal, microwave or plasma assisted decomposition of silicon precursors such as silane, $SiH_4$. These techniques, though commonly implemented in the electronics industry, are not economically viable for secondary batteries due to the typically high cost of available silane gas, which includes the costs of silane production, silane transport, and silane storage. Silane is a pyrophoric gas, capable of auto-ignition at temperatures below 54° C. (130° F.). A number of fatal industrial accidents produced by combustion and detonation of leaked silane in air have been reported. Furthermore, Silane is highly toxic. For these reasons, the safe transport and safe storage measures add to significant costs of available silane.

Secondary batteries used for consumer portable electronic devices and electric vehicles are subject to very stringent demands of competitive price reduction. Therefore, there is a need to explore alternative cost-effective and safe approaches for generation of amorphous silicon.

When the lithium-ion cell is assembled and filled with electrolyte, the anode and cathode active materials have a difference in potential of at most about 2 volts between the two. The difference in potential between the two electrodes, after the lithium-ion cell has been charged, is about 4 volts. When the lithium-ion cell is charged for the first time, lithium is extracted from the cathode and introduced into the anode. As a result, the anode potential is lowered significantly (toward the potential of metallic lithium), and the cathode potential is further increased (to become even more positive). These changes in potential may give rise to parasitic reactions on both electrodes, but more severely on the anode. For example, a decomposition product known as solid electrolyte interface (SEI) readily forms on the surfaces of anode carbon materials, wherein the SEI layer comprises lithium and electrolyte components. These surface layers or covering layers are lithium-ion conductors which establish an ionic connection between the anode and the electrolyte and prevent the reactions from proceeding any further.

Formation of this SEI layer is therefore necessary for the stability of the half-cell system comprising the anode and the electrolyte. However, as the SEI layer is formed, a portion of the lithium introduced into the cells via the cathode is irreversibly bound and thus removed from cyclic operation, i.e. from the capacity available to the user. This means that, during the course of the first discharge, not as much lithium moves from the anode back to the cathode as had previously been released to the anode during the first charging operation. This phenomenon is called irreversible capacity and is known to consume about 10% to 30% of the capacity of a lithium ion cell.

A further drawback is that the formation of the SEI layer on the anode after the first charging operation may be incomplete and will continue to progress during the subsequent charging and discharge cycles. Even though this process becomes less pronounced with an increasing number of repeated charging and discharge cycles, it still causes continuous abstraction, from the system, of lithium which is no longer available for cyclic operation and thus for the capacity of the cell. Additionally, as indicated earlier, the formation of a solid-electrolyte interface layer consumes about 10% to 30% of the amount of lithium originally stored at the cathode, which is already low in capacity (typically <200 mAh/g). Clearly, it would be a significant advantage if the cells do not require the cathode to supply all the required amount of lithium.

Therefore, in summary, a need exists for a Si-based anode active material that has a high specific capacity, a minimal irreversible capacity (or a low decay rate), and a long cycle life. One must also be able to produce this anode material cost-effectively and in a safe manner. Based on the notion that silane gas can be toxic and explosive, a need exists for a production process that does not involve the use of silane as a feedstock material. In order to accomplish these goals, we have worked diligently and intensively on the development of new electrode materials, which are in a powder form and can be incorporated with an optional binder and optional conductive additive to form an anode (negative electrode) of high areal capacity. Further, these anode materials now can be produced with a silane-free process. These research and development efforts lead to the present patent application.

SUMMARY

The present disclosure provides an anode active material for the anode (negative electrode) of a lithium battery (e.g. lithium-ion battery, lithium-sulfur battery, lithium-air battery, etc.) or sodium battery and a method of producing such an anode active material, the anode, and the battery cell. This new material enables the battery to deliver a significantly improved specific capacity and much longer charge-discharge cycle life.

In certain embodiments, the disclosure provides a silane-free method of producing a solid powder mass of multiple porous particulates having pores containing silicon (Si) therein for use as an anode active material of a lithium-ion or sodium-ion battery, the method comprising: (a) providing a porous conductive host structure having a volume fraction of pores from 5% to 99.9%, wherein the porous host structure is selected from a carbonaceous, graphitic, graphene, or metallic material in a bulk form or in a form of multiple porous particles; (b) introducing a reactant gas or vapor of a halogen that chemically reacts with a Si source disposed in a reaction chamber at a first temperature to form a silicon halide, with or without using a catalyst, wherein the halogen is selected from F, Cl, I, Br, or a combination thereof and the silicon halide is selected from $SiF_4$, $SiCl_4$, $SiI$, $SiBr_4$, $SiX_aZ_b$, or a combination thereof wherein X and Z are each a halogen element and a=1-3, b=1-3, and a+b=4 and wherein the Si source is selected from Si or a Si-rich compound containing no less than 60% by weight of Si in the compound; (c) vaporizing the silicon halide to form a vapor phase and, immediately or at a later time, directing the silicon halide vapor phase into pores of the porous host structure and facilitating the silicon halide to decompose, at a second temperature, into a halogen gas product and solid Si particles or coating deposited in the pores to form a Si-infiltrated or Si-impregnated porous host structure; and (d) optionally breaking and reducing the Si-infiltrated or Si-impregnated porous host structure into smaller porous particles, having a diameter from 50 nm to 100 μm, to obtain the solid powder mass of multiple porous particulates containing Si therein. This procedure of breaking the structure into multiple powder particles may be desired or necessary if the original starting host structure is not in a powder or particulate form.

The disclosed method in general does not make use of hydrogen in the production of silicon halide and absolutely no silane is produced or used in the production of Si. Silane or its derivative chemicals can be explosive and toxic. Typically, Si is formed inside the host pores in the form of Si particles or Si coatings having a diameter or coating thickness from 1 nm to 10 μm, more typically from 2 nm to 1 μm, and most typically from 2 nm to 200 nm.

The word "immediately" implies that the vapor phase (e.g., comprising silicon halide) does not get to be stored in a container or other containing means and then used at a later time or at a different location. Instead, these gaseous species are used and converted into Si essentially right after their formation. This completely eliminates the cost of storing and transporting intermediate products.

The halogen gas product (a reaction by-product) may be collected into a container and used later, or may be reused immediately as a reactant gas or vapor of a halogen that chemically reacts with additional Si to produce additional solid powder mass. Basically, the halogen gas can be recycled and reused.

The method may further meet at least one of the following conditions: (i) step (b) comprises further utilizing a catalyst to accelerate a chemical reaction (e.g., $Si+Br_2 \rightarrow SiBr_4$ or $Si+I_2 \rightarrow SiIt$) and/or lower the required reaction temperature; (ii) step (c) comprises introducing an inert gas to mix with the vapor phase to facilitate the transport and diffusion of the silicon halide vapor phase into pores of the porous host structure; (iii) step (c) comprises subjecting the vapor phase to a second temperature that induces decomposition of the silicon halide into Si and/or facilitating Si vapor to deposit as a solid coating or particles in the pores of the porous conductive host structure; and (iv) the Si-rich compound comprises silicon and a metal selected from the group consisting of alkali metals, alkali earth metals, transition metals, rare earth metals, and low meting point metals.

In certain embodiments, the catalyst comprises a metal, a metal alloy, a metal oxide, a metal salt, a metal hydride, a metal-containing compound, or a combination thereof, wherein the metal is selected from a group of elements consisting of noble metal elements, alkaline and alkaline earth metal elements, transition metal elements, rare earth metal elements, low melting point metal elements, and combinations thereof.

The Si disposed in the reaction chamber may be in a form of one or multiple particles, fibers, rods, plates, discs, tubes, wafer, or a combination thereof. Actually, there is no restriction on the Si dimensions or shapes. Preferably, Si has one dimension that is in the range of 1-100 nm so that the specific surface area is greater than 10 m²/g, more preferably greater than 100 m²/g, further greater than 500 m²/g, and most preferably greater than 1,000 m²/g.

In the disclosed method, the first temperature is preferably from 20° C. to 1,500° C. and the second temperature is the same as or different from the first temperature. The first temperature is more typically and preferably from 300° C. to 1,200° C. and the second temperature is greater than 250° C. and typically lower than 3,000° C., more typically lower than 2,000° C.

The porous graphene structure preferably comprises pore walls comprising graphene planes or graphene sheets selected from pristine graphene, graphene fluoride, graphene chloride, graphene bromide, graphene iodide, nitrogenated graphene, hydrogenated graphene, doped graphene, chemically functionalized graphene, graphene oxide, reduced graphene oxide, or a combination thereof.

The porous carbonaceous or graphitic particles preferably comprise particles of activated carbon, soft carbon (defined as a carbon material that is graphitizable), hard carbon (non-graphitizable even at a temperature higher than 2,500° C.), activated natural graphite, activated artificial graphite, exfoliated graphite worms, expanded graphite flakes, mesophase carbon, needle coke, or a combination thereof.

The porous metallic particles, as a host, can be selected from Cu, Al, steel, Sn, Zn, Ti, Mn, Co, Ni, or any other transition metal. The metal may be coated with a passivation layer (e.g., carbon or polymer).

The method may further comprise a procedure of encapsulating or coating the porous anode material particulates with a thin protecting layer having a thickness from 0.5 nm to 2 μm, wherein the protecting lay comprises carbon, graphene, electron-conducting polymer, lithium ion-conducting polymer, or a combination thereof.

In some embodiments, the method further includes a procedure of prelithiating the Si coating or particles deposited in the pores of the multiple particulates, wherein the Si coating or particles are prelithiated to contain an amount of lithium from 1% to 100% of a maximum lithium content contained in the Si, or the prelithiated Si particles or coating is selected from $Li_xSi$, wherein numerical x is from 0.01 to 4.4. The method may further comprise a procedure of encapsulating or coating the prelithiated multiple particulates with a thin protecting layer having a thickness from 0.5 nm to 2 μm. The protecting layer preferably comprises a carbon material, graphene, a polymer, or a lithium- or sodium-containing species chemically bonded to said particulates and said lithium- or sodium-containing species is selected from $Li_2CO_3$, $Li_2C_2O_4$, LiOH, LiCl, LiI, LiBr, $ROCO_2Li$, HCOLi, ROLi, $(ROCO_2Li)_2$, $(CH_2OCO_2Li)_2$, $Li_2S$, $Li_xSO_y$, $Li_4B$, $Na_4B$, $Na_2CO_3$, $Na_2O$, $Na_2C_2O_4$, NaOH, NaX, $ROCO_2Na$, HCONa, RONa, $(ROCO_2Na)_2$, $(CH_2OCO_2Na)_2$, $Na_2S$, $Na_xSO_y$, a combination thereof, a combination thereof with $Li_2O$ or LiF, or a combination of $Li_2O$ and LiF, wherein X=F, Cl, I, or Br, R=a hydrocarbon group, x=0-1, y=1-4.

The protecting layer may comprise a thin layer of a high-elasticity polymer having a fully recoverable tensile strain from 5% to 1,000%, and a lithium ion conductivity from $10^{-7}$ S/cm to $5×10^{-2}$ S/cm at room temperature.

The step of prelithiating may include a procedure selected from chemical prelithiation, electrochemical lithiation, solution lithiation, physical lithiation, or a combination thereof.

The method may further comprise a step of forming multiple anode material particulates, along with a binder and optional conductive additive, into an anode electrode. The method may further comprise a step of combining the anode electrode with a cathode, and an electrolyte to form a battery cell.

The present disclosure may comprise a solid powder mass of multiple anode material particulates produced by the method herein disclosed. Also provided is an anode or negative electrode, comprising multiple anode material particulates produced by the disclosed method, an optional conductive additive, and an optional binder. Further provided is a lithium-ion, lithium metal, sodium-ion, or sodium metal battery containing this anode, a cathode, and an electrolyte in ionic contact with the anode and the cathode.

In general, the deposited Si does not fully occupy the pores; preferably occupying only 5-90% by volume of the pores and further preferably 30-70% by volume, allowing a sufficient amount of voids to accommodate the volume expansion of the anode active material during the battery charging procedure.

These particulates are in a powder form that can be readily incorporated with an optional binder and optional conductive additive to form an anode (negative electrode) of high areal capacity, typically higher than 4.5 mAh/cm², more typically higher than 6 mAh/cm², further typically and desirably higher than 10 mAh/cm², still more typically and desirably higher than 20 mAh/cm², 30 mAh/cm², 50 mAh/cm², etc. These high areal capacities normally could not be achieved if one choose to deposit pure Si directly on a current collector.

The disclosure also provides a method of producing a Si-coated or Si-infiltrated host structure that is an anode current collector. The method comprises: (a) providing a solid (non-porous) or porous current collector; (b) introducing a reactant gas or vapor of a halogen that chemically reacts with Si disposed in a reaction chamber at a first temperature to form a silicon halide, with or without using a catalyst, wherein the halogen is selected from F, Cl, I, Br, or a combination thereof and the silicon halide is selected from $SiF_4$, $SiCl_4$, $SiI_4$, $SiBr_4$, $SiX_aZe$, or a combination thereof wherein X and Z are each a halogen element and a=1-3, b=1-3, and a+b=4; (c) (immediately or subsequently at a later time) vaporizing the silicon halide to form a vapor phase and directing the silicon halide vapor phase into pores or onto surfaces of the current collector and facilitating the silicon halide to decompose into solid Si particles or coating deposited at a second temperature on the current collector surface or inside pores of the current collector to form a Si-coated or Si-infiltrated current collector.

BRIEF DESCRIPTION OF THE DRAWINGS

FIG. 4(A): Schematic of a system comprising a reactor (where halogen gas, such as $Cl_2$, reacts with Si to produce silicon halide, $SiCl_4$), an optional evaporator (to ensure the silicon halide being in a vapor state), and a decomposer (where silicon halide vapor thermally decomposes into Si and halogen gas or HCl gas, if $H_2$ is introduced into the decomposition chamber) enabling the generation and deposition of Si in the pores of porous graphene/carbon host particles, according to some embodiments of the present disclosure;

FIG. 4(B): Schematic of a system comprising a reactor (where halogen gas, such as $I_2$, reacts with Si to produce silicon halide, $SiI_4$), an optional evaporator (to ensure the silicon halide being in a vapor state), and a decomposer (where silicon halide vapor thermally decomposes into Si and halogen gas) enabling the generation and deposition of Si in the pores of porous graphene/carbon host particles, according to some embodiments of the present disclosure;

DETAILED DESCRIPTION

This disclosure is related to silicon (Si)-based anode materials for high-capacity lithium batteries or sodium batteries, which are preferably secondary batteries based on a non-aqueous electrolyte, a polymer gel electrolyte, solid polymer electrolyte, quasi-solid electrolyte, inorganic solid-state electrolyte, or composite or hybrid electrolyte. The shape of a lithium metal or lithium ion battery can be cylindrical, square, button-like, etc. The present invention is not limited to any battery shape or configuration.

Figure 2:
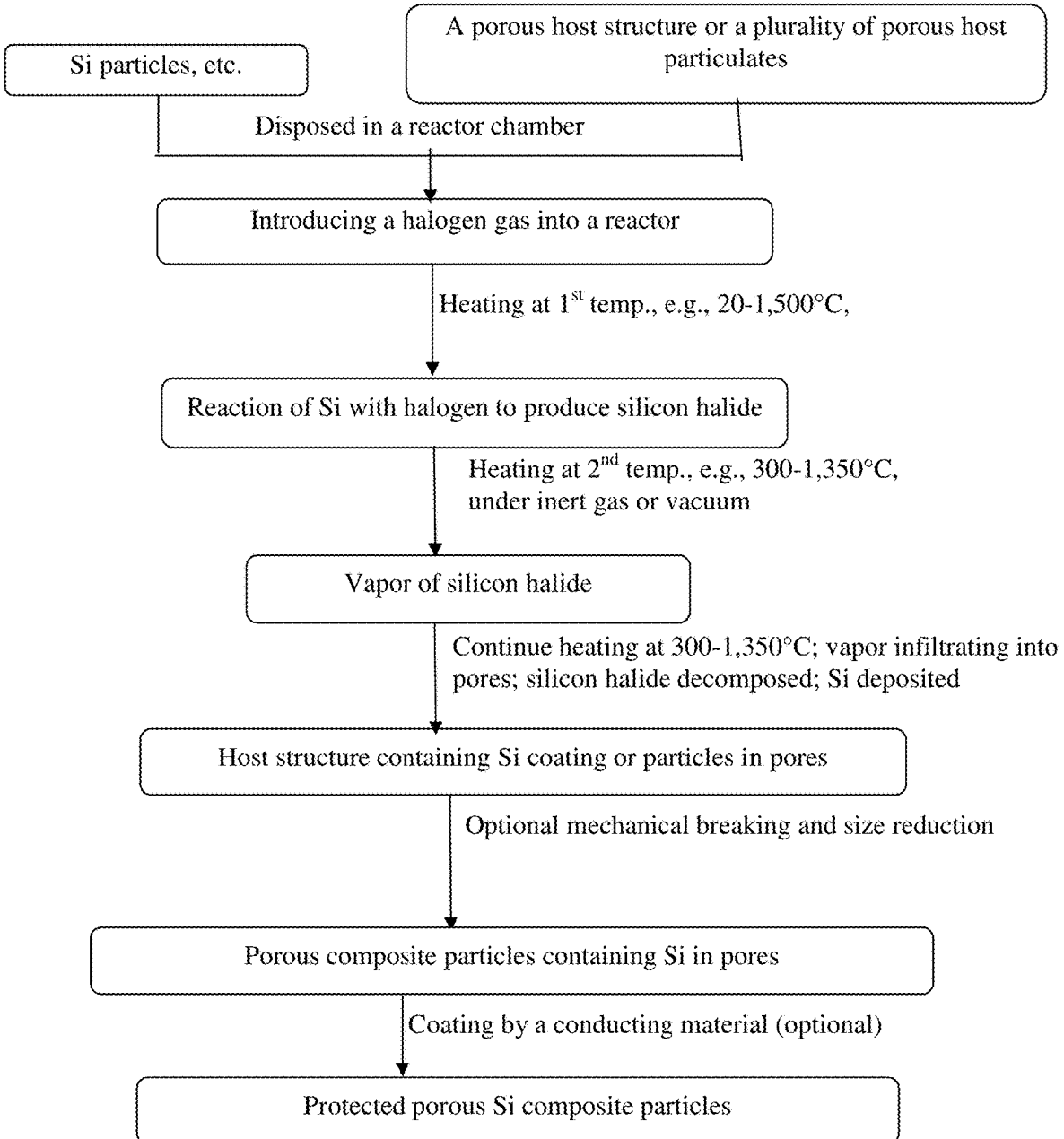
FIG. 2: A process flow chart showing preferred routes to prepare silicon residing in pores of a porous host structure according to some preferred embodiments.

In certain embodiments, as schematically illustrated in FIG. 2, the disclosure provides a silane-free method of producing a solid powder mass of multiple porous particulates having pores containing silicon (Si) therein for use as an anode active material of a lithium-ion or sodium-ion battery, the method comprising: (a) providing a porous conductive host structure having a volume fraction of pores from 5% to 99.9%, wherein the porous host structure is selected from a carbonaceous, graphitic, graphene, or metallic material in a bulk form or in a form of multiple particles; (b) introducing a reactant gas or vapor of a halogen that chemically reacts with a Si source disposed in a reaction chamber at a first temperature to form a silicon halide, with or without using a catalyst, wherein the halogen is selected from F, Cl, I, Br, or a combination thereof and the silicon halide is selected from $SiF_4$, $SiCl_4$, $SiI_4$, $SiBr_4$, $SiX_aZ_b$, or a combination thereof wherein X and Z are each a halogen element and a=1-3, b=1-3, and a+b=4 and wherein the Si source is selected from Si or a Si-rich compound containing no less than 60% (preferably >80% and more preferably >90%) by weight of Si in the compound; (c) vaporizing the silicon halide to form a vapor phase and, immediately or at a later time, directing the silicon halide vapor phase into pores of the porous host structure and facilitating the silicon halide to decompose, at a second temperature, into a halogen gas product and solid Si particles or coating deposited in the pores to form a Si-infiltrated or Si-impregnated porous host structure; and (d) optionally breaking and reducing the Si-infiltrated or Si-impregnated porous host structure into smaller porous particles, having a diameter from 50 nm to 100 μm, to obtain the solid powder mass of multiple porous particulates containing Si therein (e.g., FIG. 3(A)). This procedure of breaking the structure into multiple powder particles may be desired or necessary if the original starting host structure is not in a powder or particulate form.

Figure 1:
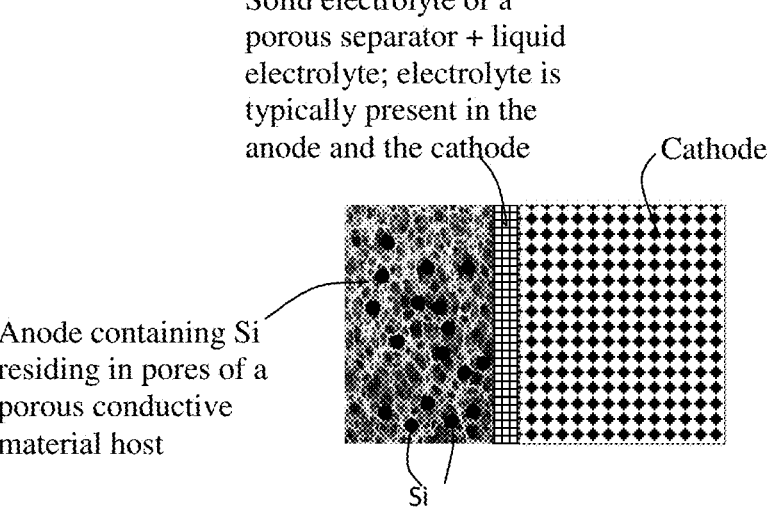
FIG. 1: Schematic of a lithium-ion cell comprising an anode (featuring a porous carbon host structure having Si residing in pores), a separator, and a cathode.

The resultant porous host structure (containing 0.1% to 98% by weight of Si residing in the pores of the host structure), when trimmed into a desired size, may be used as an anode (negative electrode) of a lithium-ion or sodium-ion battery, as schematically illustrated in FIG. 1. Alternatively, the porous composite particles, containing 0.1% to 98% by weight of Si residing in the pores, may be combined with a resin binder and an optional conductive additive to produce an anode using, for instance, the well-known slurry coating process.

The word "immediately" in step (c) implies that the silicon halide vapor phase does not get to be stored in a container or other containing means and then used at a later time and/or at a different location. Instead, these gaseous species are used and converted into Si essentially right after their formation, allowing Si species to infiltrate into pores of the conductive host structure and form a Si coating on pore walls or Si particles inside the pores. This completely eliminates the costs of storing and transporting silicon halide.

The disclosed method in general does not make use of hydrogen in the production of silicon halide and absolutely no silane is produced or used in the production of Si. Silane or its derivative chemicals can be explosive and toxic. Typically, Si is formed inside the host pores in the form of Si particles or Si coatings having a diameter or coating thickness from 1 nm to 10 μm, more typically from 2 nm to 1 μm, and most typically from 2 nm to 200 nm.

The halogen gas product (a reaction by-product) may be collected into a container and used later, or may be reused immediately as a reactant gas or vapor of a halogen that chemically reacts with additional Si to produce additional solid powder mass. Basically, the halogen gas can be recycled and reused.

The method may further meet at least one of the following conditions: (i) step (b) comprises further utilizing a catalyst to accelerate a chemical reaction (e.g., $Si+Br_2 \rightarrow SiBr_4$ or $Si+I_2 \rightarrow SiI_4$) and/or lower the required reaction temperature; (ii) step (c) comprises introducing an inert gas to mix with the vapor phase to facilitate the transport and diffusion of the silicon halide vapor phase into pores of the porous host structure; (iii) step (c) comprises subjecting the vapor phase to a second temperature that induces decomposition of the silicon halide into Si and/or facilitating Si vapor to deposit as a solid coating or particles in the pores of the porous conductive host structure; and (iv) the Si-rich compound comprises silicon and a metal selected from the group consisting of alkali metals, alkali earth metals, transition metals, rare earth metals, and low meting point metals.

In certain embodiments, the catalyst comprises a metal, a metal alloy, a metal oxide, a metal salt, a metal hydride, a metal-containing compound, or a combination thereof, wherein the metal is selected from a group of elements consisting of noble metal elements, alkaline and alkaline earth metal elements, transition metal elements, rare earth metal elements, low melting point metal elements, and combinations thereof.

The Si source disposed in the reaction chamber may be in a form of one or multiple particles, fibers, rods, plates, discs, tubes, wafer, or a combination thereof. Actually, there is no restriction on the Si dimensions or shapes. Preferably, the Si source has one dimension that is in the range of 1-100 nm so that the specific surface area is greater than 10 $m^2/g$, more preferably greater than 100 $m^2/g$, further greater than 500 $m^2/g$, and most preferably greater than 1,000 $m^2/g$.

In the disclosed method, the first temperature is preferably from 20° C. to 1,500° C. and the second temperature is the same as or different from the first temperature. The first temperature is more typically and preferably from 300° C. to 1,200° C. and the second temperature is greater than 250° C. and typically lower than 3,000° C., more typically lower than 2,000° C. These recommended temperatures come from the following chemical reaction conditions:

Silicon reacts with chlorine at temperatures above 300° C. to form silicon tetrachloride ($SiCl_4$), with the most efficient reaction occurring around 600° C. The reaction may be represented by this equation: $Si+2Cl_2 \rightarrow SiCl_4$. While some reaction can occur at lower temperatures, significant reaction between silicon and chlorine typically requires temperatures above 300° C. For synthesis of silicon tetrachloride, a temperature around 600° C. is recommended.

Silicon tetrachloride ($SiCl_4$) begins to significantly decompose into silicon (Si) at around 1,250° C. This decomposition typically occurs when $SiCl_4$ is exposed to high temperatures optionally in the presence of a reducing agent, like hydrogen. While the exact temperature can vary depending on conditions, 1,250° C. is considered the approximate point where $SiCl_4$ starts to noticeably break down into silicon. In the presence of hydrogen (if so desired), the decomposition reaction can be represented as: $SiCl_4 (g)+2 H_2 (g) \rightarrow Si (s)+4 HCl (g)$.

Fluorine readily reacts with silicon at room temperature, meaning the reaction occurs even at relatively low temperatures, making it one of the most reactive halogen elements with silicon; the primary reaction product is silicon tetrafluoride ($SiF_4$).

The reaction between fluorine and silicon happens readily at room temperature. At lower temperatures, the primary product is $SiF_4$. At significantly higher temperatures, the production of $SiF_2$ may become more prominent.

Silicon tetrafluoride ($SiF_4$) does not readily decompose into elemental silicon at typical temperatures; however, at very high temperatures exceeding 1000° C. (around 1200° C. or higher), significant decomposition can occur, with the exact temperature depending on the specific conditions and presence of other reactants.

Iodine reacts with silicon (Si) at temperatures above 300° C. While the reaction can occur at lower temperatures, it becomes significantly faster and more noticeable at temperatures exceeding 300° C., forming silicon tetraiodide ($SiI_4$) as the product. Unlike some other halogen reactions with silicon, like with fluorine, iodine needs heat to react readily with silicon. The primary product of the reaction is silicon tetraiodide ($SiI_4$).

Silicon tetraiodide ($SiI_4$) decomposes into silicon (Si) at a temperature around 287.4° C. (549.3° F.), which is its boiling point; meaning that when heated to this temperature, it readily vaporizes and breaks down into its constituent elements, silicon and iodine.

Bromine reacts with silicon (Si) at temperatures above 300° C.; while not readily reacting at room temperature, the reaction becomes significant when heated, forming silicon tetrabromide ($SiBr_4$) as the primary product. It can also be produced by treating silicon-copper mixture with bromine: $Si+Br_2 \rightarrow SiBr_4$. Silicon reacts with all halogens (including bromine, chlorine, fluorine, and iodine) to form silicon tetrahalides, but the reaction with bromine requires elevated temperatures.

$SiBr_4$ began to decompose at 800° C. simultaneously with the evolution of tribromosilane ($SiHBr_3$) if H2 is introduced into the decomposer, which was followed by the deposition of silicon.

FIG. 4(A) schematically shows a system comprising (i) a reactor (where halogen gas, such as $Cl_2$, reacts with Si to produce silicon halide, $SiCl_4$), (ii) an optional evaporator (to ensure the silicon halide being in a vapor state), and (iii) a decomposer where silicon halide vapor thermally decomposes into Si and halogen gas or HCl gas (if $H_2$ is introduced into the decomposition chamber) enabling the generation and deposition of Si in the pores of porous graphene, carbon, or metallic host particles, according to some embodiments of the present disclosure;

FIG. 4(B) schematically shows a similar system comprising a reactor (where halogen gas, such as $I_2$, reacts with Si to produce silicon halide, $SiI_4$), an optional evaporator (to ensure the silicon halide being in a vapor state), and a decomposer (where silicon halide vapor thermally decomposes into Si and halogen gas, $I_2$) enabling the generation and deposition of Si in the pores of porous graphene/carbon or metallic host particles, according to some embodiments of the present disclosure.

Figure 4C:
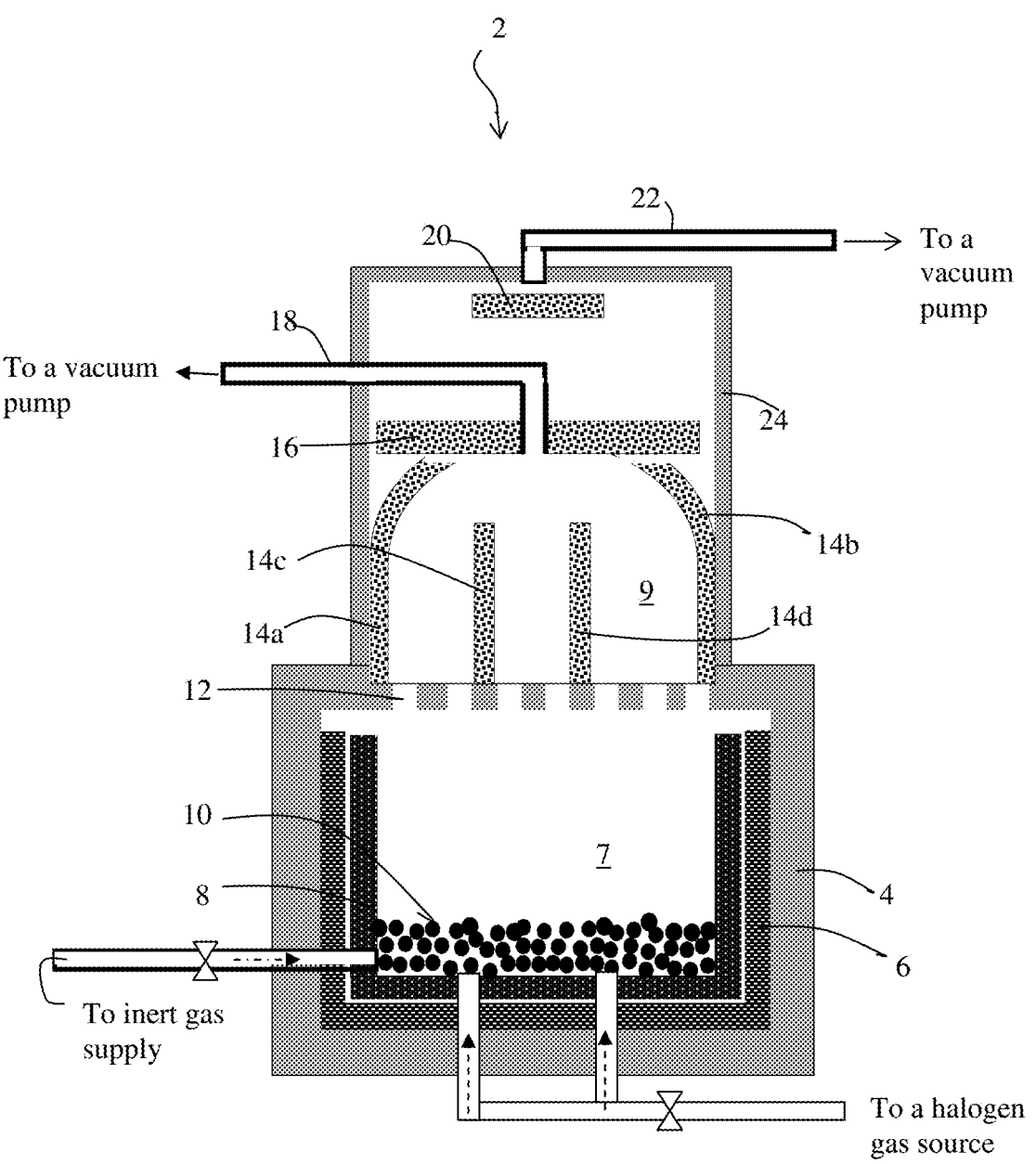
FIG. 4(C): Schematic of an apparatus that can be used to produce composites comprising porous conductive host structure containing Si therein, according to some embodiments of the present disclosure.

FIG. 4(C) schematically shows an apparatus 2 that can be used to produce Si coating or particles deposited in the pores of a conductive material host structure (e.g., in a rod, plate, film, or disc form or in the form of multiple particles having a size from 50 nm to 100 μm, preferably 100 nm to 50 μm, most preferably no greater than 30 μm), according to some preferred embodiments of the present disclosure. In certain embodiments, this apparatus has a supporting body 4 that hosts a crucible 8 to accommodate the starting reactant materials (e.g., a mixture 10 of catalyst (optional) and Si particles, or Si-containing compound, in a first chamber 7). This crucible may be heated by a heating provision (e.g., heating elements 6) that brings the temperature of the reactants to a first temperature (e.g., in the range of 200° C. to 1,650° C., preferably from 500° C. to 1,500° C.) for a first period of time (e.g., typically several minutes, but can be hours if so desired) to allow for the formation of a vapor phase containing silicon halide vapor). The vapor phase is generated by catalytic gasification of the silicon or Si-containing material through the reaction of silicon or Si-containing material with the halogen source optionally in the presence of a catalyst at an elevated temperature. The halogen gas may be preferably introduced to come in contact with the reactant materials (e.g., mixture 10) and, in combination with an optional stream of inert gas, halogen gas helps to carry the resulting silicon halide vapor phase toward a conductive porous host structure (e.g., 14*a*, 14*b*, 14*c*, 14*d*, 16, or 20).

The silicon halide vapor phase is introduced to an infiltration and deposition chamber 9 (or a different zone of the same chamber) at a second temperature (the same as or different than the first temperature) for a second period of residence time (e.g., typically several minutes, but can be hours if so desired). This second temperature enables the desired chemical reaction that decomposes silicon halide into Si (along with other byproduct chemical species, such as halogen gases) under a vacuum or inert gas condition. The halogen gas may be collected and reused.

In one preferred embodiment, vacuum pumps (not shown) are operated to help move the silicon halide vapor through channels 12 into the second chamber 9, which is disposed in the upper portion (defined by 24) of the apparatus. Vacuum pumps also promote infiltration of the vapor phase into pores of the host structures. Multiple porous conductive host structures 14*a*, 14*b*, 14*c*, 14*d*, 16, 20 may be disposed in this second chamber 9 to accommodate the infiltrating Si or silicon halide vapor that deposits as a Si solid particle or coating inside the pores of a host.

It may be noted that the apparatus does not have to have 2 chambers (e.g., 7 and 9). One may choose to use just one chamber, but two or three zones at two or three desired temperatures in the same chamber. The starting reactants in the first zone contain a mixture of Si (or a Si-containing compound) and an optional catalyst (e.g., catalyst particles or coating on Si surfaces) and react with the halogen source at the first temperature to generate a vapor phase containing silicon halide. The vapor phase is directed to flow and infiltrate into pores of a porous host structure at a second temperature which facilitates deposition of Si in the pores.

If a porous host structure is in a bulk form (e.g., a porous slab, sheet, film, rod, etc.), the resultant Si-infiltrated host structure may be subjected to a mechanical breaking procedure (e.g., air jet milling, ball milling, etc.) to generate porous composite particles of a suitable size (e.g., 100 nm to 100 μm, preferably smaller than 30 μm) each comprising Si therein. Alternatively, if the host structure is in a form of porous particles (e.g., activated carbon particles or porous graphene balls), one may choose to use a fluidized bed to move these porous particles around in the deposition chamber. A fluidized bed, spouted bed, or packed bed reactor may be used in the system.

Figure 4D:
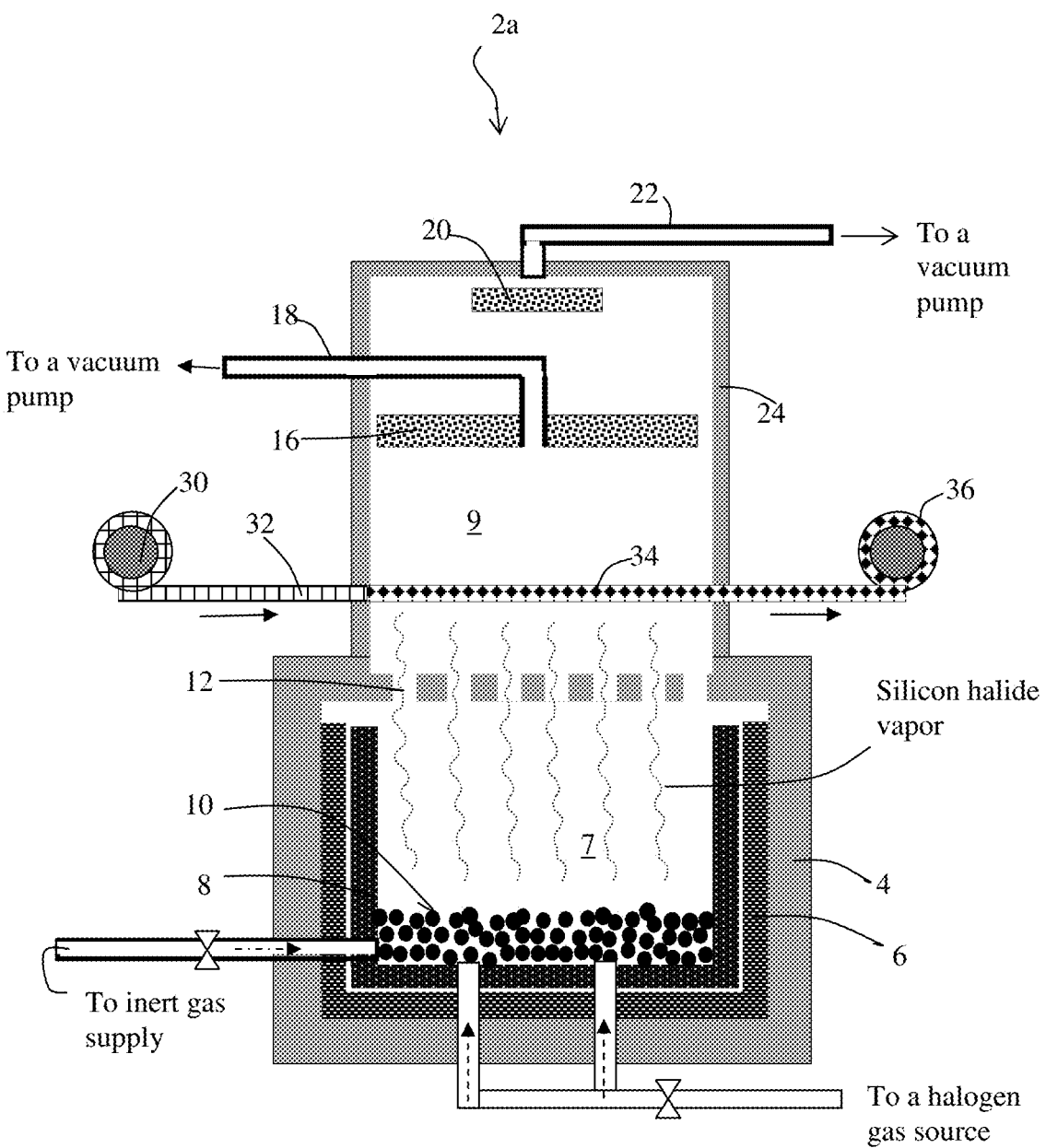
FIG. 4(D): Schematic of an apparatus that can be used to produce a continuous host structure containing Si therein, according to some embodiments of the present disclosure.

There can be different variants of the desired apparatus or system for producing porous host structures containing Si therein. For instance, FIG. 4(D) schematically shows an apparatus 2a that can be used to produce Si coating or particles deposited in pores of a conductive material host structure in a roll-to-roll manner, according to some preferred embodiments of the present disclosure. FIG. 4(D) is similar to FIG. 4(C), but there are some significant differences. One of the unique features of FIG. 4(D) is a roll-to-roll system that comprises a feeder roller 30, which provides a roll of flexible porous host structure 32 (e.g., a roll of flexible graphene foam having open cells or pores). This host structure 32 is fed into the Si deposition zone 9 where silicon halide vapor phase permeates into pores of the host structure, allowing the formation of Si coating or particles inside the pores to form a Si-infiltrated host structure 34. This Si-infiltrated host structure 34 is moved toward a collector roller 36 and gets collected by the collector winding roller. Subsequently, this Si-infiltrated host structure may be cut into multiple pieces of anode or mechanically milled to become small porous composite particulates having a size from 50 nm to 100 μm (more preferably from 100 nm to 30 μm).

Alternatively, using substantially the same apparatus as FIG. 4(D) as an example, the host structure 32 may be a current collector foil (e.g., foil of Cu, Ni, stainless steel, and graphene-coated Al). A surface of this current collector foil is then deposited with a layer of Si in the deposition zone 9. The Si-deposited current collector foil is then collected on the collector roller 36. Such a Si-coated foil may be optionally coated with a protective layer (e.g., carbon) and cut into a desired shape and dimension for use as an anode.

The silicon-rich compound is preferably selected from one or a combination of silicon with alkali metals, alkali earth metals, transition metals, rare earth metals, and low meting point metals, especially, Si—(Li, Na, K, Ns, Be, Mg, Ca, Sr, Ba, Al, Ga, In, Tl, K, and Fe) in the forms of slab, bulk, rod, granule, powder, melt, suspension in liquid, and gas phase vapor.

The catalyst is preferably selected from the group consisting of: a) noble metals, especially, Pd, Pt, Rh, Re, Ru, and the alloys thereof; b) transition metals, especially, Ni, Cu, Co Fe, and the alloys thereof; c) alkali metals, especially, Na, K, Li, Ca and the alloys thereof; d) rare earth metals; e) metal salts; metal compound such as oxide, and f) metal hydrides.

The catalyst or gasification promoter may be selected from one member or any combination of members from the following groups: a) metals defined above, especially, noble and transition metals; b) alkali metals and the alkaline earth metals; lithium (Li), sodium (Na), potassium (K), rubidium (Rb), caesium (Cs), and francium (Fr) group 2 elements, beryllium (Be), magnesium (Mg), calcium (Ca), strontium (Sr), barium (Ba), and radium (Ra); c) Rare earth metal: Lanthanide Series Lanthanum, Cerium, Praseodymium, Neodymium, Promethium, Samarium, Europium, Gadolinium Terbium, Dysprosium, Holmium, Erbium, Thulium, Ytterbium, Lutetium; Actinide Series Actinium, Thorium, Protactinium, Uranium, Neptunium, Plutonium, Americium Curium, Berkelium, Californium, Einsteinium, Fermium, Mendelevium, Nobelium, Lawrencium; d) Group III-VI metal; e) alloys hydrides; and f) metal compounds such as oxides, organic and inorganic salts of the metal elements set forth above.

Catalyst preparation and loading is another factor to consider ii the presently disclosed process. Preferably, catalyst is widely dispersed with or on the Si-material that is in direct contact with hydrogen gasification sources, Catalyst may be added into silicon when it is metallurgically produced, a procedure similar to alloying, or added during the grinding process, or even loaded to the surface of the final granules from solution, provided the catalyst can be uniformly distributed. The loading of catalyst can be from 0.0001 wt % to 80 wt % (preferably 0.01% to 20% by weight), depending on the nature of the silicon and alloy materials. For example, for silicon ingot, 0.001 wt % of catalyst can be added to the surface, but for fine silicon powders, since they have a large specific surface area, as much as 20 wt % of catalyst should be present to fully cover the surface. Further preferably, catalyst can be recovered from the gasification reactor unit and returned into the catalyst loading/raw material preparation unit.

In the catalytic reaction, the chemical reaction is accelerated by the presence of a catalyst or promoter; but the catalyst is not converted into or incorporated in the desirable product of the reaction. In the procedure of Si-material catalytic gasification, the reaction between Si-material and halogen source in the presence of a catalyst occur under elevated temperature and pressure conditions, depending on the nature of the combination. The reaction products contain at least one type of silicon halide gas phase product when directed to move toward the porous host structure.

It may be noted that the same or a similar apparatus can be implemented to deposit Si onto an anode current collector (e.g., a Cu foil) to directly produce a Si-based anode (negative electrode). The Si deposition time in the second chamber or the second zone of the same chamber may be varies from minutes to hours to achieve a desired Si thickness deposited on a Cu foil surface to have a high specific areal capacity ($mAh/cm^2$).

Alternatively, one may choose to produce porous particulates (in a powder form) that can be readily incorporated with an optional binder and optional conductive additive to form a thick anode (negative electrode) of high areal capacity, typically higher than 4.5 $mAh/cm^2$, more typically higher than 6 $mAh/cm^2$, further typically and desirably higher than 10 $mAh/cm^2$, still more typically and desirably higher than 20 $mAh/cm^2$, 30 $mAh/cm^2$, 50 $mAh/cm^2$, etc. These high areal capacities normally could not be achieved if one chooses to deposit pure Si directly on a current collector.

The porous graphene particles preferably comprise pore walls comprising graphene sheets selected from pristine graphene, graphene fluoride, graphene chloride, graphene bromide, graphene iodide, nitrogenated graphene, hydrogenated graphene, doped graphene, chemically functionalized graphene, graphene oxide, reduced graphene oxide, or a combination thereof. The production of these graphene materials is well-known in the art.

There are a broad array of porous graphene particles (also herein referred to as graphene balls) that can be included in the disclosed graphene composite structure. Some examples are schematically shown in FIGS. 3(A) and 3(B).

Figure 3A:
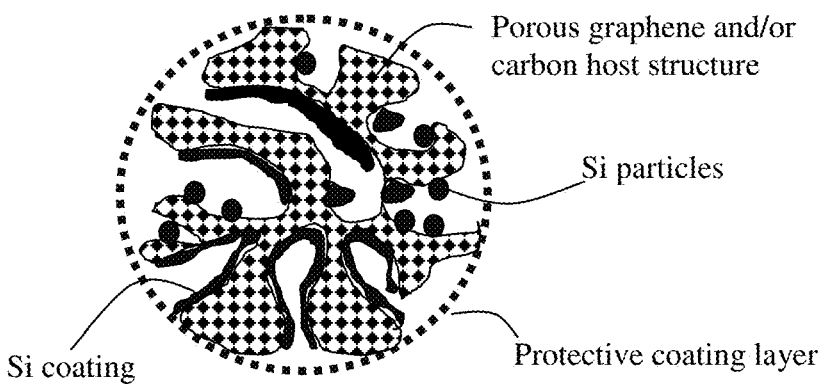
FIG. 3(A): Schematic of an example of porous graphene/carbon host particle containing Si coating or Si nano particles residing in pores of the host according to some preferred embodiments.
Figure 3B:
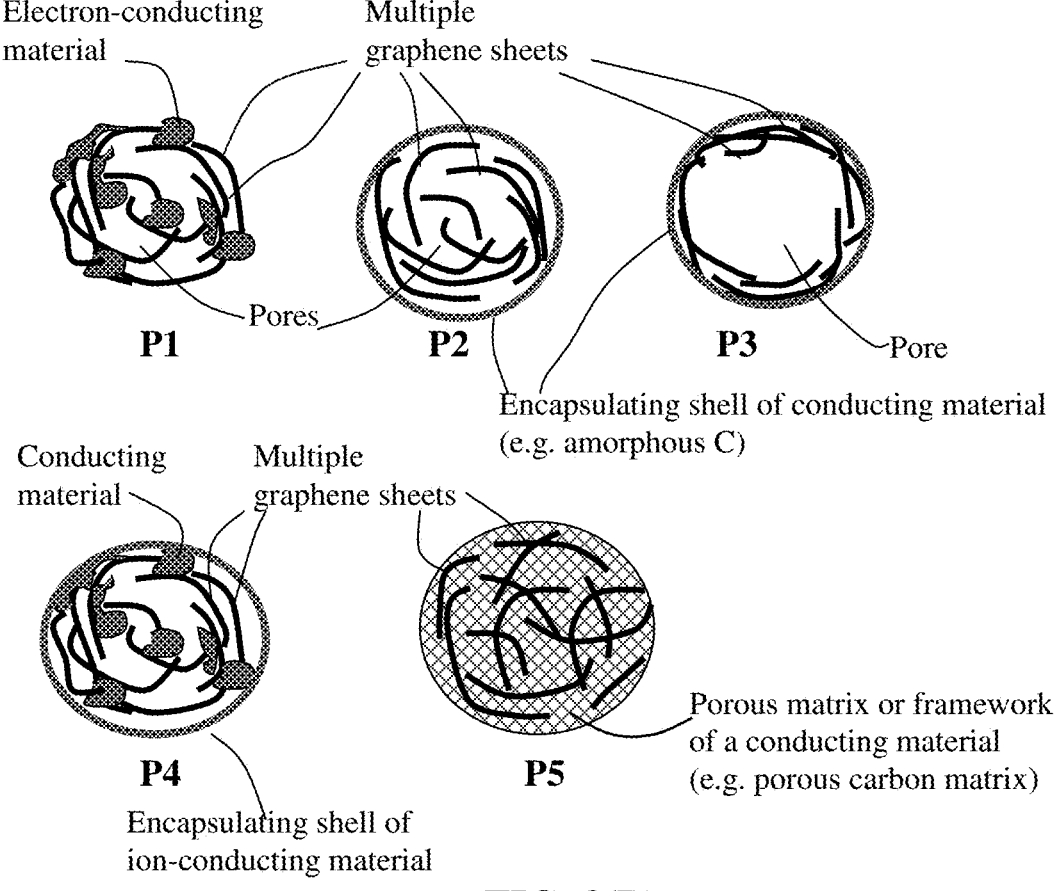
FIG. 3(B) Schematic of 5 illustrative examples of porous graphene composite balls that can serve as a host structure to accommodate the Si coating or Si nano particles in pores of the host according to some preferred embodiments.

As schematically illustrated in FIG. 3(A), the graphene ball comprises self-bonded graphene sheets (e.g., graphene oxide sheets) in the pore walls that are (1) chemically linked/merged together (edge-to-edge and/or face-to-face) typically at a temperature from 100 to 1,500° C. for graphene oxide sheets and/or (2) re-organized into larger graphite crystals or domains (herein referred to as re-graphitization) along the pore walls at a high temperature (typically >2,100° C. and more typically >2,500° C.) during the presently disclosed heat treatment procedure.

The porous carbonaceous or graphitic particles preferably comprise particles of activated carbon, soft carbon (defined as a carbon material that is graphitizable), hard carbon (not graphitizable even at a temperature higher than 2,500° C.), activated natural graphite, activated artificial graphite, exfoliated graphite worms, expanded graphite flakes, mesophase carbon, needle coke, or a combination thereof.

In some embodiments, the process further includes a procedure of prelithiating the multiple anode material particulates, wherein said anode material is prelithiated to contain an amount of lithium from 1% to 100% of a maximum lithium content contained in said anode active material.

The anode active material (e.g., Si coating) on the pore walls of porous host particles may be prelithiated before or after the anode fabrication, for the purpose of improving the first-cycle efficiency of a resulting lithium-ion cell. Prelithiation of anode active materials, such as Si, can be accomplished in several different ways that can be classified into 3 categories: physical methods, electrochemical methods, and chemical methods. The chemical methods are typically conducted by sourcing lithium atoms from active reactants or lithium metal. The active reactants can include organo-metallic compounds and lithium salts and the reactions can be effectuated ex-situ (in a chemical reactor before anode fabrication, or after anode fabrication but before cell assembly). One may also bring lithium metal in direct contact with particles of the desired anode active material in a dry condition or with the presence of a liquid electrolyte.

A physical process entails depositing a Li coating on a surface of an anode active material substrate (e.g., a layer of Si-containing particles), followed by promoting thermally induced diffusion of Li into the substrate (e.g., into the interior of a Si deposited on pore walls of host particles). A thin lithium layer can be deposited on the surface of an anode material substrate using a standard thin film process, such as thermal evaporation, electron beam evaporation, sputtering, and laser ablation. A vacuum is preferably used during the deposition process to avoid reactivity between the atomic lithium and molecules of lithium-reactive substances such as water, oxygen, and nitrogen. A vacuum of greater than 1 milli-Torr is desirable. When electron beam deposition is used a vacuum of $10^{-4}$ Torr is desired and a vacuum of $10^{-6}$ Torr is preferred to avoid interaction between the electron beam and any residual air molecules.

The evaporative deposition techniques involve the heating of a lithium metal to create a lithium vapor. The lithium metal can be heated by an electron beam or by resistive heating of the lithium metal. The lithium vapor deposits lithium onto a substrate composed of packed Si-containing particles. To promote the deposition of lithium metal the substrate can be cooled or maintained at a temperature lower than the temperature of the lithium vapor. A thickness monitor such as a quartz crystal type monitor can be placed near the substrate to monitor the thickness of the film being deposited. Alternatively, laser ablation and sputtering techniques can be used to promote thin lithium film growth on a substrate. For example, argon ions can be used in the sputtering process to bombard a solid lithium metal target. The bombarding knocks lithium off of the target and deposits it on the surface of a substrate. Laser ablation processes can be used to knock lithium off of a lithium target. The separated lithium atoms are then deposited onto the substrate. The lithium-coated layer of packed Si-containing particles (Si as an example of an anode active material) is then immersed into a liquid electrolyte containing a lithium salt dissolved in an organic solvent. Lithium atoms rapidly permeate into the bulk of Si particles to form prelithiated Si particles. Physical methods may also be conducted by simply mixing molten lithium metal with particles of the anode particulates.

The anode active material preferably comprises silicon and the prelithiated particles comprise a prelithiated silicon $Li_4Si$, $Li_{4.4}Si$, or $Li_xSi$, wherein numerical x is between 1 and 4.4.

The prelithiated anode active material particles may be subsequently subjected to a surface treatment that produces a surface-stabilizing coating to embrace the prelithiated particles, wherein this surface-stabilizing coating is an ion-conducting material layer, such as a polymer electrolyte, an ion-conducting elastomer, a layer of composite comprising lithium- or sodium-containing species that are chemically bonded to the prelithiated particles.

The protective layer of the instant invention typically exhibits a lithium ion or sodium ion conductivity from $2.5 \times 10^{-5}$ S/cm to $5.5 \times 10^{-3}$ S/cm, and more typically from $1.0 \times 10^{-4}$ S/cm to $2.5 \times 10^{-3}$ S/cm. The anode active material may be made into a thin film and then the Li- or Na-containing species are coated thereon and then peeled off to allow for ion conductivity measurement.

Several micro-encapsulation processes can be used to embrace/encapsulate particles of an anode active material (with or without prelithiation) with a protective layer. This preferably requires dissolution of a lithium salt, a sodium salt, multiple lithium salts, and/or multiple sodium salts in a solvent (including mixture of multiple solvents) to form a solution. This solution can then be used to encapsulate solid particles via several of the micro-encapsulation methods to be discussed in what follows. The same type of encapsulation processes may be used to encapsulate the disclosed porous conducting host particles containing an anode active material deposited therein, with or without prelithiation.

There are three broad categories of micro-encapsulation methods that can be implemented to produce encapsulated particles of an anode active material: physical methods, physico-chemical methods, and chemical methods. The physical methods include pan-coating, air-suspension coating, centrifugal extrusion, vibration nozzle, and spray-drying methods. The physico-chemical methods include ionotropic gelation and coacervation-phase separation methods.

The chemical methods include interfacial polycondensation or other surface reactions. Several methods are discussed below as examples.

Pan-coating method: The pan coating process involves tumbling the active material particles in a pan or a similar device while the encapsulating material (e.g. highly concentrated solution of Li/Na salts in a solvent) is applied slowly until a desired encapsulating shell thickness is attained.

Air-suspension coating method: In the air suspension coating process, the solid particles (core material) are dispersed into the supporting air stream in an encapsulating chamber. A controlled stream of a salt-solvent solution (with an optional polymer) is concurrently introduced into this chamber, allowing the solution to hit and coat the suspended particles. These suspended particles are encapsulated (fully coated) with the salts while the volatile solvent is removed, leaving a very thin layer of Li and/or Na salts on surfaces of these particles. This process may be repeated several times until the required parameters, such as full-coating thickness (i.e. encapsulating shell or wall thickness), are achieved. The air stream which supports the particles also helps to dry them, and the rate of drying is directly proportional to the temperature of the air stream, which can be adjusted for optimized shell thickness.

In a preferred mode, the particles in the encapsulating zone portion may be subjected to re-circulation for repeated coating. Preferably, the encapsulating chamber is arranged such that the particles pass upwards through the encapsulating zone, then are dispersed into slower moving air and sink back to the base of the encapsulating chamber, enabling repeated passes of the particles through the encapsulating zone until the desired encapsulating shell thickness is achieved.

Centrifugal extrusion: Anode active materials may be encapsulated using a rotating extrusion head containing concentric nozzles. In this process, a stream of core fluid (slurry containing particles of an anode active material dispersed in a solvent) is surrounded by a sheath of shell solution or melt. As the device rotates and the stream moves through the air it breaks, due to Rayleigh instability, into droplets of core, each coated with the shell solution. While the droplets are in flight, the molten shell may be hardened or the solvent may be evaporated from the shell solution. If needed, the capsules can be hardened after formation by catching them in a hardening bath. Since the drops are formed by the breakup of a liquid stream, the process is only suitable for liquid or slurry. A high production rate can be achieved. Up to 22.5 kg of microcapsules can be produced per nozzle per hour and extrusion heads containing 16 nozzles are readily available.

Vibrational nozzle method: Core-shell encapsulation of an anode active material can be conducted using a laminar flow through a nozzle and vibration of the nozzle or the liquid. The vibration has to be done in resonance with the Rayleigh instability, leading to very uniform droplets. The liquid can consist of any liquids with limited viscosities (1-50,000 mPa·s): emulsions, suspensions or slurry containing the anode active material. The solidification can be done according to the used gelation system with an internal gelation (e.g. sol-gel processing, melt) or an external (additional binder system, e.g. in a slurry).

Spray-drying: Spray drying may be used to encapsulate particles of an active material when the active material is dissolved or suspended in a melt or polymer solution. In spray drying, the liquid feed (solution or suspension) is atomized to form droplets which, upon contacts with hot gas, allow solvent to get vaporized and thin polymer shell to fully embrace the solid particles of the active material.

It may be noted that the anode active material (e.g., prelithiated or non-lithiated particulates) may be coated with a carbonizable coating material (e.g., phenolic resin, poly (furfuryl alcohol), coal tar pitch, or petroleum pitch). The coating can then be carbonized to produce an amorphous carbon or polymeric carbon coating on the surface of these particulates.

Such a conductive surface coating can help maintain a network of electron-conducting paths during repeated charge/discharge cycles and prevent undesirable chemical reactions between Si and electrolyte from happening. Hence, the presently invented method may further comprise a step of coating a surface of the particulates with a thin layer of carbon having a thickness less than 1 μm. The thin layer of carbon preferably has a thickness less than 100 nm. Such a thin layer of carbon may be obtained from pyrolization of a polymer, pitch, or organic precursor or obtained by chemical vapor deposition, physical vapor deposition, sputtering, etc.

Alternatively, the particulates containing an anode active material therein may be coated with a layer of electron-conducting polymer or ion-conducting polymer. Such coating processes are well-known in the art.

The surface-stabilized or surface-stabilized and prelithiated particles of an anode active material (with or without a coating of carbon, graphene, electron-conducting polymer, or ion-conducting polymer) may be further encapsulated by a thin layer of a high-elasticity polymer (e.g. an elastomer) having a fully recoverable tensile strain of from 5% to 700% and a thickness preferably from 0.5 nm to 2 μm (preferably from 1 nm to 100 nm). The elastomer preferably has a lithium ion conductivity from $10^{-7}$ S/cm to $5 \times 10^{-2}$ S/cm at room temperature (preferably and typically no less than $10^{-6}$ S/cm, further preferably no less than $10^{-5}$ S/cm, more preferably no less than $10^{-4}$ S/cm, and most preferably no less than $10^{-3}$ S/cm).

In others, the elastomeric material is an elastomer matrix composite containing from 0.1% to 50% by weight (preferably from 1% to 35% by weight) of a lithium ion-conducting additive dispersed in an elastomer matrix material.

In some embodiments, the elastomeric material contains a material selected from natural polyisoprene (e.g. cis-1,4-polyisoprene natural rubber (NR) and trans-1,4-polyisoprene gutta-percha), synthetic polyisoprene (IR for isoprene rubber), polybutadiene (BR for butadiene rubber), chloroprene rubber (CR), polychloroprene (e.g. Neoprene, Baypren etc.), butyl rubber (copolymer of isobutylene and isoprene, IIR), including halogenated butyl rubbers (chloro butyl rubber (CIIR) and bromo butyl rubber (BIIR), styrene-butadiene rubber (copolymer of styrene and butadiene, SBR), nitrile rubber (copolymer of butadiene and acrylonitrile, NBR), EPM (ethylene propylene rubber, a copolymer of ethylene and propylene), EPDM rubber (ethylene propylene diene rubber, a terpolymer of ethylene, propylene and a diene-component), epichlorohydrin rubber (ECO), poly-acrylic rubber (ACM, ABR), silicone rubber (SI, Q, VMQ), fluorosilicone rubber (FVMQ), fluoroelastomers (FKM, and FEPM; such as Viton, Tecnoflon, Fluorel, Aflas and Dai-El), perfluoroelastomers (FFKM: Tecnoflon PFR, Kalrez, Chemraz, Perlast), polyether block amides (PEBA), chlorosulfonated polyethylene (CSM; e.g. Hypalon), and ethylene-vinyl acetate (EVA), thermoplastic elastomers (TPE), protein resilin, protein elastin, ethylene oxide-epichlorohydrin copolymer, polyurethane, urethane-urea copolymer, and combinations thereof.

The urethane-urea copolymer film usually consists of two types of domains, soft domains and hard ones. Entangled linear backbone chains consisting of poly(tetramethylene ether) glycol (PTMEG) units constitute the soft domains, while repeated methylene diphenyl diisocyanate (MDI) and ethylene diamine (EDA) units constitute the hard domains. The lithium ion-conducting additive can be incorporated in the soft domains or other more amorphous zones.

In some embodiments, the elastomeric material is an elastomer matrix composite containing a lithium ion-conducting additive dispersed in an elastomer matrix material, wherein said lithium ion-conducting additive is selected from $Li_2CO_3$, $Li_2O$, $Li_2C_2O_4$, LiOH, LiX, $ROCO_2Li$, HCOLi, ROLi, $(ROCO_2Li)_2$, $(CH_2OCO_2Li)_2$, $Li_2S$, $Li_xSO_y$, or a combination thereof, wherein X=F, Cl, I, or Br, R=a hydrocarbon group, x=0-1, y=1-4.

In some embodiments, the elastomeric material is an elastomer matrix composite containing a lithium ion-conducting additive dispersed in an elastomer matrix material, wherein said lithium ion-conducting additive contains a lithium salt selected from lithium perchlorate, $LiClO_4$, lithium hexafluorophosphate, $LiPF_6$, lithium borofluoride, $LiBF_4$, lithium hexafluoroarsenide, $LiAsF_6$, lithium trifluoro-metasulfonate, $LiCF_3SO_3$, bis-trifluoromethyl sulfonylimide lithium, $LiN(CF_3SO_2)_2$, lithium bis(oxalato)borate, LiBOB, lithium oxalyldifluoroborate, $LiBF_2C_2O_4$, lithium oxalyldifluoroborate, $LiBF_2C_2O_4$, lithium nitrate, $LiNO_3$, Li-Fluoroalkyl-Phosphates, $LiPF_3(CF_2CF_3)_3$, lithium bisperfluoro-ethylsulfonylimide, LiBETI, lithium bis (trifluoromethanesulphonyl)imide, lithium bis(fluorosulphonyl)imide, lithium trifluoromethanesulfonimide, LiTFSI, an ionic liquid-based lithium salt, or a combination thereof.

The elastomeric material may contain a mixture or blend of an elastomer and an electron-conducting polymer selected from polyaniline, polypyrrole, polythiophene, polyfuran, a bi-cyclic polymer, derivatives thereof (e.g. sulfonated versions), or a combination thereof.

In some embodiments, the elastomeric material contains a mixture or blend of an elastomer and a lithium ion-conducting polymer selected from poly(ethylene oxide) (PEO), Polypropylene oxide (PPO), poly(acrylonitrile) (PAN), poly(methyl methacrylate) (PMMA), poly(vinylidene fluoride) (PVdF), Poly bis-methoxy ethoxyethoxide-phosphazenex, Polyvinyl chloride, Polydimethylsiloxane, poly(vinylidene fluoride)-hexafluoropropylene (PVDF-HFP), a derivative thereof (e.g. sulfonated versions), or a combination thereof.

In the preparation of an anode electrode, acetylene black (AB), carbon black (CB), or ultra-fine graphite particles may be used as a conductive additive. Conductive additives may comprise an electrically conductive material selected from the group consisting of electro-spun nano fibers, carbonized electro-spun nano fibers, vapor-grown carbon or graphite nano fibers, carbon or graphite whiskers, carbon nano-tubes, nano-scaled graphene platelets, metal nano wires, metal-coated nano wires, carbon-coated nano wires, metal-coated nano fibers, carbon-coated nano fibers, and combinations thereof. A binder material may be chosen from polytetrafluoroethylene (PTFE), polyvinylidene fluoride (PVDF), ethylene-propylene-diene copolymer (EPDM), or styrene-butadiene rubber (SBR), for example. Conductive materials such as electronically conductive polymers, meso-phase pitch, coal tar pitch, and petroleum pitch may also be used as a binder. A typical mixing ratio of these ingredients is 80 to 85% by weight for the anode active material, 5 to 15% by weight for the conductive additive, and 5 to 10% by weight for the binder. The current collector may be selected from aluminum foil, stainless steel foil, and nickel foil. There is no particularly significant restriction on the type of current collector, provided the material is a good electrical conductor and relatively corrosion resistant. The separator may be selected from a polymeric nonwoven fabric, porous polyethylene film, porous polypropylene film, or porous PTFE film.

The electrode fabrication may comprise combining multiple fine particles of prelithiated anode active material with a conductive additive and/or a binder material, plus a desired amount of another type of anode active materials selected from particles of graphite, hard carbon, soft carbon, mesocarbon micro-bead, surface-modified graphite, carbon-coated graphite, or a combination thereof.

Hence, a lithium ion battery may contain an anode that comprises at least two types of anode active material wherein at least one type of active material is prelithiated (e.g., Si and Sn) and at least one type of active material is not prelithiated (e.g., carbonaceous material, such as graphite, hard carbon, soft carbon, surface-modified graphite, chemically modified graphite, or meso-carbon micro-beads, MCMBs). Prelithiated carbonaceous anode materials are unstable in regular room air. The present invention enable the battery to contain an anode that comprises at least a non-carbon active material possessing an ultra-high lithium absorbing capacity (e.g., Si that exhibits a specific capacity up to 4,200 mAh/g). The battery comprises an anode that contains an excess amount of lithium (disposed inside a non-carbon anode active material, not on its surface) to compensate for the formation of SEI layers, in addition to providing enough lithium to intercalate into (or form a compound with) a cathode active material.

The present invention allows the excess amount of lithium to be stored in high-capacity anode active materials (there is no need to make use of the full capacity of Si, for instance). The capacity limitation is on the cathode side, rather than the anode side. The present approach obviates the need for the cathode to supply the needed lithium, thereby further reducing the needed initial weight of the cathode or increasing the cathode weight that can be incorporated in a cell. This strategy can increase the overall capacity of a lithium ion battery by another 10%-20%.

There is no limitation on the types of cathode materials that can pair up with the presently invented anode materials. The positive electrode active material may be selected from a wide variety of oxides, such as lithium-containing nickel oxide, lithium-containing cobalt oxide, lithium-containing nickel-cobalt oxide, lithium-containing vanadium oxide, lithium iron phosphate, lithium manganese phosphate, lithium manganese-iron phosphate, and other lithium metal (or mixed metals) phosphate. Positive electrode active material may also be selected from chalcogen compounds, such as titanium disulfate or molybdenum disulfate. More preferred are lithium cobalt oxide (e.g., $Li_xCoO_2$ where $0.8 \leq x \leq 1$), lithium nickel oxide (e.g., $LiNiO_2$), lithium manganese oxide (e.g., $LiMn_2O_4$ and $LiMnO_2$), lithium iron phosphate, lithium manganese-iron phosphate, lithium vanadium phosphate because these oxides provide a relatively high cell voltage and relatively good cycling stability.

Lithium cobalt oxide ($LiCoO_2$) is one of the most important cathode materials used in lithium-ion secondary batteries. $LiCoO_2$ and other similar lithium transition metal oxides, such as lithium manganese oxide, lithium nickel oxide, and lithium vanadium oxide, can be prepared by various methods using different lithium and transition metal sources. In general, bulk transition metal oxides are prepared by solid-state reactions, which involve repeated heat processes at high temperatures. Such processes generally afford the thermodynamically more stable phases and in general, microcrystalline materials are obtained. Lower temperatures and mild processing conditions may be used for several methods, such as co-precipitation, sol-gel process with/without template, synthesis by precursor, ion-exchange reaction and hydrothermal. These methods also result in particles with better control of morphology and smaller size. Other methods include flame spray pyrolysis, dehydro-freezing evaporation, supercritical dehydration, supersonic hydrothermal synthesis, and ultrasonic processing.

As an example, a process for producing lithium-cobalt oxide my include (a) mixing cobalt oxide having an average particle size of not more than 0.1 μm, with a lithium compound; and (b) calcining the obtained mixture at a temperature of 500 to 850° C. As compared to the conventional processes that begin with larger cobalt oxide particles (e.g., diameter>10 μm), such a process is advantageous in that lithium-cobalt oxide particles (1) can be produced with a short calcination time, (2) have a narrow particle size distribution, and (3) have a uniform small particle size.

The flame-spray pyrolysis method may include the steps of: (a) spraying minute droplets containing a solution of dissolved lithium salt and cobalt salt at room temperature; (b) atomizing the minute droplets through rapid expansion into a high temperature environment generated by combusting oxygen and hydrogen; (c) decomposing and oxidizing the atomized minute droplets thermally at high temperature to produce nano-sized oxides in gaseous phase; and (d) collecting the produced nano-sized composite oxides particles.

Lithium iron phosphate $LiFePO_4$ is a promising candidate of cathode material for lithium-ion batteries. The advantages of $LiFePO_4$ as a cathode active material includes a high theoretical capacity (170 mAh/g), environmental benignity, low resource cost, good cycling stability, high temperature capability, and prospect for a safer cell compared with $LiCoO_2$. A major drawback with this material is that it has very low electronic conductivity, on the order of $10^{-9}$ S/cm$^2$. This renders it difficult to prepare cathodes capable of operating at high rates. In addition, poor solid-phase transport means that the utilization of the active material is a strong function of the particle size. This major problem may be overcome by using a nano-scaled powder (to reduce the Li ion diffusion path and electron transport path distance) and doping the powder with a transition metal. Lithium iron phosphate ($LiFePO_4$) nano particles may be prepared by ball milling of conventional micron-sized particles, which may be prepared by a solid state reaction using $LiOH \cdot H_2O$, $(CH_3COO)_2Fe$, and $NH_4H_2PO_4$ as raw materials. Additionally, $Li_{1.3}Al_{0.3}Ti_{1.7}(PO_4)_3$ materials, as an example of lithium mixed-metal phosphate, may be successfully prepared by the solution deposition using lithium acetate, aluminum nitrate, ammonium dihydrogen phosphate and titanium butoxide as starting materials. The resulting material may be ball-milled to sub-micron or nanometer scales. This is but one example of a host of complex metal phosphate-based cathode materials.

A wide range of electrolytes can be incorporated into the lithium cells. Most preferred are non-aqueous and polymer gel electrolytes although other types can be used. The non-aqueous electrolyte to be employed herein may be produced by dissolving an electrolytic salt in a non-aqueous solvent. Any known non-aqueous solvent which has been employed as a solvent for a lithium secondary battery can be employed. A non-aqueous solvent mainly consisting of a mixed solvent comprising ethylene carbonate (EC) and at least one kind of non-aqueous solvent whose melting point is lower than that of aforementioned ethylene carbonate (hereinafter referred to as a second solvent) may be preferably employed. This non-aqueous solvent is advantageous in that it is (a) stable against a negative electrode containing a carbonaceous material well developed in graphite structure; (b) effective in suppressing the reductive or oxidative decomposition of electrolyte; and (c) high in conductivity. A non-aqueous electrolyte solely composed of ethylene carbonate (EC) or fluorinated EC is advantageous in that it is relatively stable against decomposition through a reduction by a graphitized carbonaceous material. However, the melting point of EC is relatively high, 39 to 40° C., and the viscosity thereof is relatively high, so that the conductivity thereof is low, thus making EC alone unsuited for use as a secondary battery electrolyte to be operated at room temperature or lower. The second solvent to be used in a mixture with EC functions to make the viscosity of the solvent mixture lower than that of EC alone, thereby promoting the ion conductivity of the mixed solvent. Furthermore, when the second solvent having a donor number of 18 or less (the donor number of ethylene carbonate is 16.4) is employed, the aforementioned ethylene carbonate can be easily and selectively solvated with lithium ion, so that the reduction reaction of the second solvent with the carbonaceous material well developed in graphitization is assumed to be suppressed. Further, when the donor number of the second solvent is controlled to not more than 18, the oxidative decomposition potential to the lithium electrode can be easily increased to 4 V or more, so that it is possible to manufacture a lithium secondary battery of high voltage.

Preferable second solvents are dimethyl carbonate (DMC), methylethyl carbonate (MEC), diethyl carbonate (DEC), ethyl propionate, methyl propionate, propylene carbonate (PC), .gamma.-butyrolactone (.gamma.-BL), acetonitrile (AN), ethyl acetate (EA), propyl formate (PF), methyl formate (MF), toluene, xylene and methyl acetate (MA). These second solvents may be employed singly or in a combination of two or more. More desirably, this second solvent should be selected from those having a donor number of 16.5 or less. The viscosity of this second solvent should preferably be 28 cps or less at 25° C.

The mixing ratio of the aforementioned ethylene carbonate in the mixed solvent should preferably be 10 to 80% by volume. If the mixing ratio of the ethylene carbonate falls outside this range, the conductivity of the solvent may be lowered or the solvent tends to be more easily decomposed, thereby deteriorating the charge/discharge efficiency. More preferable mixing ratio of the ethylene carbonate is 20 to 75% by volume. When the mixing ratio of ethylene carbonate in a non-aqueous solvent is increased to 20% by volume or more, the solvating effect of ethylene carbonate to lithium ions will be facilitated and the solvent decomposition-inhibiting effect thereof can be improved.

Examples of preferred mixed solvent are a composition comprising EC and MEC; comprising EC, PC and MEC; comprising EC, MEC and DEC; comprising EC, MEC and DMC; and comprising EC, MEC, PC and DEC; with the volume ratio of MEC being controlled within the range of 30 to 80%. By selecting the volume ratio of MEC from the range of 30 to 80%, more preferably 40 to 70%, the conductivity of the solvent can be improved. With the purpose of suppressing the decomposition reaction of the solvent, an electrolyte having carbon dioxide dissolved therein may be employed, thereby effectively improving both the capacity and cycle life of the battery.

The electrolytic salts to be incorporated into a non-aqueous electrolyte may be selected from a lithium salt such as lithium perchlorate ($LiClO_4$), lithium hexafluorophosphate ($LiPF_6$), lithium borofluoride ($LiBF_4$), lithium hexafluoroarsenide ($LiAsF_6$), lithium trifluoro-meta-sulfonate ($LiCF_3SO_3$) and bis-trifluoromethyl sulfonylimide lithium [$LiN(CF_3SO_2)_2$]. Among them, $LiPF_6$, $LiBF_4$ and $LiN(CF_3SO_2)_2$ are preferred. The content of aforementioned electrolytic salts in the non-aqueous solvent is preferably from 0.5 to 2.0 mol/l.

Example 1: Production of Porous Graphene Balls from Flake Graphite and Si Deposition in the Pores of Graphene Balls In a representative procedure, 1 kg of polypropylene (PP) pellets, 50 grams of flake graphite, 50 mesh (average particle size 0.18 mm; Asbury Carbons, Asbury NJ) and 250 grams of magnetic steel balls were placed in a high-energy ball mill container. The ball mill was operated at 300 rpm for 2 hours. The container lid was removed and stainless steel balls were removed via a magnet. The polymer carrier material was found to be coated with a dark graphene layer. Carrier material was placed over a 50 mesh sieve and a small amount of unprocessed flake graphite was removed.

A sample of the coated carrier material was then submitted to air flow suspension in a heating chamber, wherein the graphene-coated PP particles were heat-treated at 350° C. and then at 600° C. for 2 hours to produce individual (isolated/separated) porous graphene balls.

In a separate experiment, the same batch of PP pellets and flake graphite particles (without the impacting steel balls) were placed in the same high-energy ball mill container and the ball mill was operated under the same conditions for the same period of time. The results were compared with those obtained from impacting ball-assisted operation. The graphene sheets isolated from PP particles, upon PP dissolution, are mostly single-layer graphene. The graphene balls produced from this process typically have a higher level of porosity (lower physical density).

After the porous graphene balls were prepared, they were mechanically compressed and compacted into porous sheets and positioned in the deposition zone of the reactor (FIG. 4(C)).

As a silicon halide source, metallurgical-grade Si was milled into powder of approximately 150-mesh in size. The Si particles were heated in a crucible of the reactor featuring a flow of chemically-pure iodine at 600° C. to generate silicon iodide ($SiI_4$) vapor. The $SiI_4$ vapor was directed to impinge upon the porous graphene ball sheets (at 720° C.), and permeate into pores of these open-cell graphene balls. The graphene balls were impregnated with Si, but still maintaining a desired porosity level (pore-to-Si volume ratio varying from 1.25 to 33).

Example 2: Production of Porous Graphene Particulates Using Expanded Graphite (>100 nm in Thickness) as the Graphene Source and Production of Si-Infiltrated Graphene Particulates In an experiment, 100 grams of acrylonitrile-butadiene-styrene copolymer (ABS) pellets, as the sacrificial material particles, were placed in a plastic container along with 5 grams of expanded graphite. This container was part of an attritor mill, which was operated for 30 minutes-2 hours. After processing, particles of the sacrificial material were found to be coated with a thin layer of graphene-like material. A small sample of graphene-coated sacrificial material was placed in acetone and subjected to ultrasound energy to speed dissolution of the ABS. The solution was filtered using an appropriate filter and washed four times with additional acetone. Subsequent to washing, filtrate was dried in a vacuum oven set at 60° C. for 2 hours. This sample was examined by optical microscopy and Raman spectroscopy, and found to be graphene. The remaining graphene-coated ABS particles were then immersed in acetone, without ultrasonication, to produce graphene particulates, which were subjected to carbonization at 600-900° C.) for 2 hours to obtain porous particulates of different porosity levels.

Porous graphene particulates were then placed in the decomposition chamber (as schematically illustrated in FIG. 4(B)) of a quartz tube and Si particles (2.2 μm in size) were placed in the reaction zone set at a temperature of 600° C. An evaporator zone had a temperature of 700° C. and the decomposition zone was set at 800° C. to produce Si-infiltrated graphene balls.

As a separate (ask, the procedure was similar to that in the previous paragraph, but the conductive material host structures used in a configuration of FIG. 4(B) were Cu foil (non-porous) and Ni foam (porous with interconnected pores) as anode current collectors. Si was directly deposited on a Cu foil surface or into pores of the Ni foam sheet.

Example 3: Production of Activated Carbon by Chemical Activation of MCMBs by $ZnCl_2$, Followed by Deposition of Si in the Pores We used two different amounts of starting material (400 g and 100 g). Other than this difference in starting amounts, all other variables were the same in the following activation procedures. The particles were impregnated with zinc chloride ($ZnCl_2$) at 1:1 wt. ratio and were kept at 80° C. for 14 h. Heat treatments were then carried out under constant nitrogen flow (5 l/h). The heat treatment temperature was raised at 4° C./min up to 500° C., which was maintained for 3 h. The samples were then washed to remove excess reagent and dried at 110° C. for about 3 h. The resulting samples were labeled as CA (chemically activated only). Part of these samples was then also submitted to physical activation. Temperature was raised to 900° C. at a rate of 25° C./min, under nitrogen flow. At 900° C., the samples were then contacted with steam (0.8 kg/h) for 30 min. These samples were then labeled as CAPA (both chemically and physically activated). It was observed that combined physical and chemical activation treatments led to a higher porosity level and slightly higher pore sizes that are more readily accessible to liquid electrolyte.

Porous activated graphite particulates were then placed in the decomposition chamber (as schematically illustrated in FIG. 4(A)) of a quartz tube and Si particles (2.2 μm in size) were placed in the reaction zone set at a temperature of 600° C. Chlorine gas as introduced as the desired halogen gas. An evaporator zone had a temperature of 850° C. and the decomposition zone was set at 1,350° C. to produce Si-infiltrated graphene balls. In a separate experiment, hydrogen gas was introduced into the decomposition zone to accelerate the process; in this experiment, HCl was collected as the exhaust gas.

Example 4: Chemical Activation of MCMBs by KOH, NaOH, and their Mixtures and Deposition of Si in the Pores In this example, several MCMB samples were separately mixed with KOH, NaOH, and their mixtures (30/70, 50/50, and 70/30 weight ratios) to obtain reactant blends. The blends were then heated to a desired temperature (in the range of 700-950° C.) and maintained at this temperature for 0.5-12 hours to produce various activated MCMB samples. The resulting structures vary with the previous heat treatment history of MCMBs, activation temperature, and activation time. The following observations were made:

1) The maximum heat treatment temperature ($T_{max}$) the MCMBs saw prior to the chemical activation dictates the number of graphene planes in graphene ligaments and the maximum porosity level of the resulting porous particles. A $T_{max}$ in the range of 500-1,500° C. tends to result in thinner ligaments (1-3 graphene planes); $T_{max}$ of 1,500-2,500° C. leads to 3-7 graphene planes; and $T_{max}$ of 2,500-3,000° C. leads to 7-20 graphene planes. A higher $T_{max}$ for a longer period of heat treatment time leads to a higher degree of graphitization of MCMBs and progressively smaller amount of amorphous zones left in the MCMB.

2) Given the same MCMBs, a higher activation temperature and longer activation time lead to a higher porosity level, but the number of graphene planes in graphene ligaments appears to be relatively independent of the activation time and temperature.

3) An excessively long activation time (e.g. >3 hours) would consume too much carbon material, reducing the production yield of the 3D graphene skeleton particles.

For the deposition of Si in the pores, porous MCMB particles were used as a host and were placed in the decomposition chamber (as schematically illustrated in FIG. 4(A)) of a quartz tube and Si particles (2.2 μm in size) were placed in the reaction zone set at a temperature of 50° C. Fluorine gas as introduced as the desired halogen gas. An evaporator zone had a temperature of 750° C. and the decomposition zone was set at 1,350° C. to produce Si-infiltrated graphene balls.

Subsequently, chemical lithiation of the Si coating was conducted by using 1 M lithium-biphenyl (Li-Bp)/tetrahydrofuran (THF) solution as the prelithiation reagent. Biphenyl (Bp) was chosen because of its unique chemical/electrochemical behavior in different solvents. In ether solvents (e.g., dimethoxyethane (DME) and THF), it can react with lithium metal and form a strong reducing reagent of Li-Bp. Moreover, the resulting Li-Bp solution is relatively stable toward air and moisture, which is critical to the prelithiation in ambient air. Prelithiation was conducted by simply immersing the Sn-containing porous MCMB particles in the prelithiation reagent at room temperature for 10-100 minutes. The prelithiated Si-containing carbon particles were subsequently immersed in a liquid polymer solution consisting of PVDF-HFP dissolved in NMP and then retreated from the liquid solution and dried in a vacuum oven at 60° C. overnight to obtain surface-protected prelithiated anode particulates.

The electrodes were made of these porous, prelithiated particles, mixed with 5 wt % Super-P® and 7 wt % polytetrafluoroethylene (PTFE) binder. The procedure of slurry coating on Cu foil was conducted to produce electrodes having a thickness from 60 μm to 420 μm.

The invention claimed is:

1. A method of producing a solid powder mass of multiple porous particulates having pores containing silicon (Si) therein for use as an anode active material of a lithium-ion or sodium-ion battery, said method comprising:

(a) providing a porous conductive host structure having a volume fraction of pores from 5% to 99.9%, wherein the porous host structure is selected from a carbonaceous, graphitic, graphene, or metallic material in a bulk form or in a form of multiple porous particles;

(b) introducing a reactant gas or vapor of a halogen that chemically reacts with a Si source disposed in a reaction chamber at a first temperature to form a silicon halide with or without using a catalyst, wherein the halogen is selected from F, Cl, I, Br, or a combination thereof and the silicon halide is selected from $SiF_4$, $SiCl_4$, SiI, $SiBr_4$, $SiX_aZ_b$, or a combination thereof wherein X and Z are each a halogen element and a=1-3, b=1-3, and a+b=4 and wherein the Si source is selected from Si or a Si-rich compound containing no less than 60% by weight of Si in the compound; and (c) vaporizing said silicon halide to form a vapor phase and, immediately or at a later time, directing said silicon halide vapor phase into pores of said porous host structure and facilitating said silicon halide to decompose, at a second temperature, into a halogen gas product and solid Si particles or coating deposited in said pores to form a Si-infiltrated or Si-impregnated porous host structure.

2. The method of claim 1, further including breaking and reducing said Si-infiltrated or Si-impregnated porous host structure into smaller porous particles, having a diameter from 50 nm to 100 μm, to obtain the solid powder mass of multiple porous particulates containing Si therein.

3. The method of claim 1, wherein said halogen gas product is collected into a container or reused as a reactant gas or vapor of a halogen that chemically reacts with additional Si to produce additional solid powder mass.

4. The method of claim 1, wherein the method further meets at least one of the following conditions: (i) step (b) comprises further utilizing a catalyst to accelerate a chemical reaction and/or lower the required reaction temperature; (ii) step (c) comprises introducing an inert gas to mix with said vapor phase to facilitate the transport and diffusion of said silicon halide vapor phase into pores of said porous host structure; (iii) step (c) comprises subjecting the vapor phase to a second temperature that induces decomposition of the silicon halide into Si and/or facilitating Si vapor to deposit as a solid coating or particles in the pores of the porous conductive host structure; and (iv) the Si-rich compound comprises silicon and a metal selected from the group consisting of alkali metals, alkali earth metals, transition metals, rare earth metals, and low meting point metals.

5. The method of claim 4, wherein the catalyst comprises a metal, a metal alloy, a metal oxide, a metal salt, a metal hydride, a metal-containing compound, or a combination thereof, wherein the metal is selected from a group of elements consisting of noble metal elements, alkaline and alkaline earth metal elements, transition metal elements, rare earth metal elements, low melting point metal elements, and combinations thereof.

6. The method of claim 1, wherein the Si source disposed in the reaction chamber is in a form of one or multiple particles, fibers, rods, plates, discs, tubes, wafer, or a combination thereof.

7. The method of claim 1, wherein the first temperature is from 20° C. to 1,500° C. and the second temperature is the same as or different from the first temperature.

8. The method of claim 1, wherein the first temperature is from 300° C. to 1,200° C. and the second temperature is greater than 250° C.

9. The method of claim 1, wherein said porous graphene structure comprises pore walls comprising graphene sheets selected from pristine graphene, graphene fluoride, graphene chloride, graphene bromide, graphene iodide, nitrogenated graphene, hydrogenated graphene, doped graphene, chemically functionalized graphene, graphene oxide, reduced graphene oxide, or a combination thereof.

10. The method of claim 1, wherein said porous carbonaceous or graphitic particles comprise particles of activated carbon, soft carbon, hard carbon, activated natural graphite, activated artificial graphite, exfoliated graphite worms, expanded graphite flakes, meso-phase carbon, needle coke, or a combination thereof.

11. The method of claim 1, further comprising a procedure of encapsulating or coating the porous particulates with a thin protecting layer having a thickness from 0.5 nm to 2 $\mu$m, wherein the protecting lay comprises carbon, graphene, electron-conducting polymer, lithium ion-conducting polymer, or a combination thereof.

12. The method of claim 1, further comprising a procedure of prelithiating the Si coating or particles deposited in the pores of the multiple particulates, wherein said Si coating or particles are prelithiated to contain an amount of lithium from 1% to 100% of a maximum lithium content contained in said Si, or the prelithiated Si particles or coating is selected from $Li_xSi$, wherein numerical x is from 0.01 to 4.4.

13. The method of claim 12, further comprising a procedure of encapsulating or coating the prelithiated multiple particulates with a thin protecting layer having a thickness from 0.5 nm to 2 $\mu$m.

14. The method of claim 13, wherein said protecting layer comprises a carbon material, graphene, a polymer, or a lithium- or sodium-containing species chemically bonded to said particulates and said lithium- or sodium-containing species is selected from $Li_2CO_3$, $Li_2C_2O_4$, LiOH, LiCl, LiI, LiBr, $ROCO_2Li$, HCOLi, ROLi, $(ROCO_2Li)_2$, $(CH_2OCO_2Li)_2$, $Li_2S$, $Li_xSO_y$, $Li_4B$, $Na_4B$, $Na_2CO_3$, $Na_2O$, $Na_2C_2O_4$, NaOH, NaX, $ROCO_2Na$, HCONa, RONa, $(ROCO_2Na)_2$, $(CH_2OCO_2Na)_2$, $Na_2S$, $Na_xSO_y$, a combination thereof, a combination thereof with $Li_2O$ or LiF, or a combination of $Li_2O$ and LiF, wherein X=F, Cl, I, or Br, R=a hydrocarbon group, x=0-1, y=1-4.

15. The method of claim 14, wherein said protecting layer comprises a thin layer of a high-elasticity polymer having a fully recoverable tensile strain from 5% to 1,000%, and a lithium ion conductivity from $10^{-7}$ S/cm to $5\times10^{-2}$ S/cm at room temperature.

16. The method of claim 12, wherein said step of prelithiating includes a procedure selected from chemical prelithiation, electrochemical lithiation, solution lithiation, physical lithiation, or a combination thereof.

17. The method of claim 1, further comprising a step of forming said multiple porous particulates, along with a binder, into an anode electrode.

18. The method of claim 17, wherein said forming step further includes a conductive additive.

19. The method of claim 17, further comprising a step of combining said anode electrode with a cathode, and an electrolyte to form a battery cell.

20. A method of producing a Si-coated or Si-infiltrated host structure, said method comprising (a) providing a solid or porous current collector; (b) introducing a reactant gas or vapor of a halogen that chemically reacts with a Si source disposed in a reaction chamber at a first temperature to form a silicon halide with or without using a catalyst, wherein the halogen is selected from F, Cl, I, Br, or a combination thereof and the silicon halide is selected from $SiF_4$, $SiCl_4$, $SiI_4$, $SiBr_4$, $SiX_aZ_b$, or a combination thereof wherein X and Z are each a halogen element and a=1-3, b=1-3, and a+b=4; and wherein the Si source is selected from Si or a Si-rich compound containing no less than 60% by weight of Si in the compound; (c) vaporizing said silicon halide to form a vapor phase and directing said silicon halide vapor phase into pores or onto surfaces of said current collector and facilitating said silicon halide to decompose into solid Si particles or coating deposited at a second temperature on said current collector surface or inside pores of the current collector to form a Si-coated or Si-infiltrated current collector.

* * * * *